US006583497B2

(12) United States Patent
Xia et al.

(10) Patent No.: US 6,583,497 B2
(45) Date of Patent: Jun. 24, 2003

(54) SURFACE TREATMENT OF C-DOPED $SiO_2$ FILM TO ENHANCE FILM STABILITY DURING $O_2$ ASHING

(75) Inventors: Li-Qun Xia, San Jose, CA (US); Tian-Hoe Lim, Santa Clara, CA (US); Frederic Gaillard, Voiron (FR); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/192,274

(22) Filed: Jul. 9, 2002

(65) Prior Publication Data

US 2003/0008528 A1 Jan. 9, 2003

Related U.S. Application Data

(62) Division of application No. 09/633,495, filed on Aug. 7, 2000, now Pat. No. 6,465,372.

(30) Foreign Application Priority Data

Aug. 17, 1999 (EP) ........................................ 99402072

(51) Int. Cl.[7] ........................................ H01L 23/58
(52) U.S. Cl. ........................................ 257/642
(58) Field of Search ........................................ 438/787, 789, 438/790; 257/642, 678

(56) References Cited

U.S. PATENT DOCUMENTS 5,314,845 A * 5/1994 Lee et al. ................... 438/763
5,338,362 A * 8/1994 Imahashi ..................... 118/719
5,532,191 A * 7/1996 Nakano et al. ............. 438/692
5,605,867 A * 2/1997 Sato et al. .................. 438/790
5,610,105 A * 3/1997 Vines et al. ................ 438/789
5,741,740 A * 4/1998 Jang et al. .................. 438/435
5,872,065 A * 2/1999 Sivaramakrishnan ....... 438/784
5,900,290 A * 5/1999 Yang et al. ................. 427/577

* cited by examiner

*Primary Examiner*—David Nelms
*Assistant Examiner*—Thao P. Le
(74) *Attorney, Agent, or Firm*—Townsend and Townsend and Crew

(57) ABSTRACT

A method for forming an insulation layer over a substrate. The method forms a carbon-doped silicon oxide layer by thermal chemical vapor deposition using an organosilane. The carbon-doped silicon oxide layer is subsequently cured and densified. In one embodiment, the cured film is densified in a nitrogen-containing plasma. The method is particularly suitable for deposition of low dielectric constant films, i.e., where k is less than or equal to 3.0. Low-k, carbon-doped silicon oxide methylsilane or di-, tri-, tetra-, or phenylmethylsilane. and ozone. The above method can be carried out in a substrate processing system having a process chamber; a substrate holder, a heater, a gas delivery system, and a power supply, all of which are coupled to a controller. The controller contains a memory having a computer-readable medium with a program embodied for directing operation of the system in accordance with above method.

27 Claims, 23 Drawing Sheets

11
13a
13b
15b
20

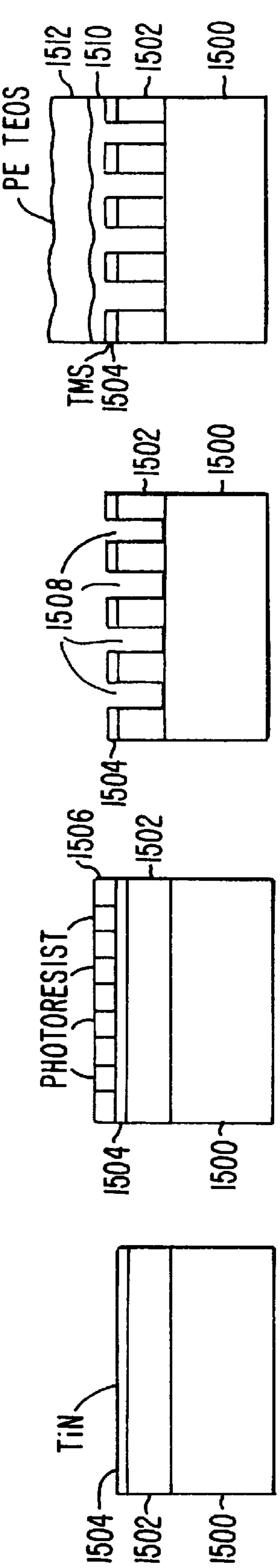
1512
1510
1502
1500
PE TEOS
TMS
1504
FIG. 15D.
1508
1502
1500
1504
FIG. 15C.
1506
1502
PHOTORESIST
1504
1500
FIG. 15B.
TiN
1504
1502
1500
FIG. 15A.
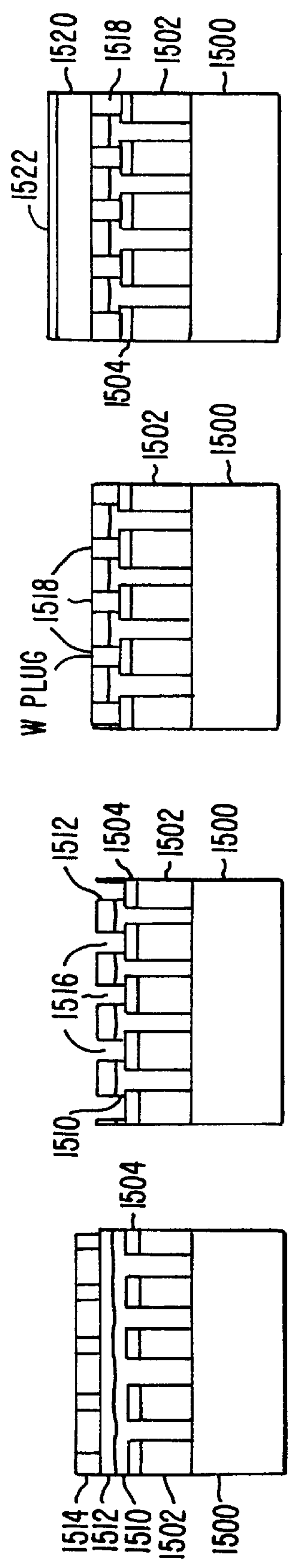
1520
1518
1502
1500
1522
1504
FIG. 15H.
1502
1500
1518
W PLUG
FIG. 15G.
1512
1504
1502
1500
1516
1510
FIG. 15F.
1504
1514
1512
1510
1502
1500
FIG. 15E.

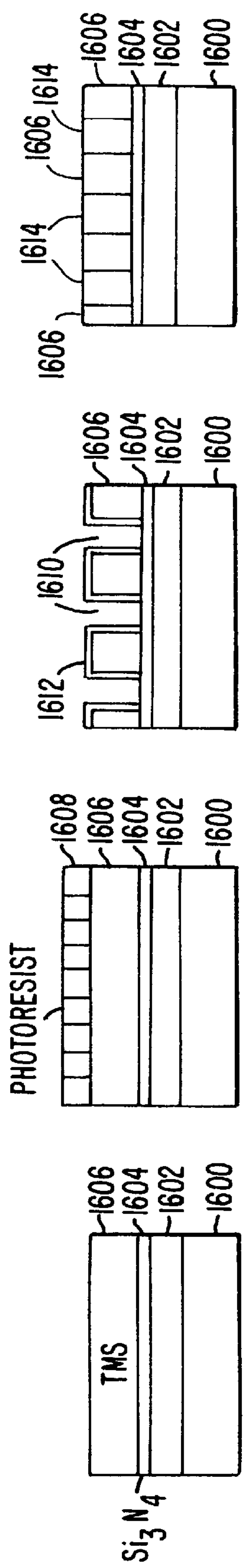
FIG. 16A.
FIG. 16B.
FIG. 16C.
FIG. 16D.
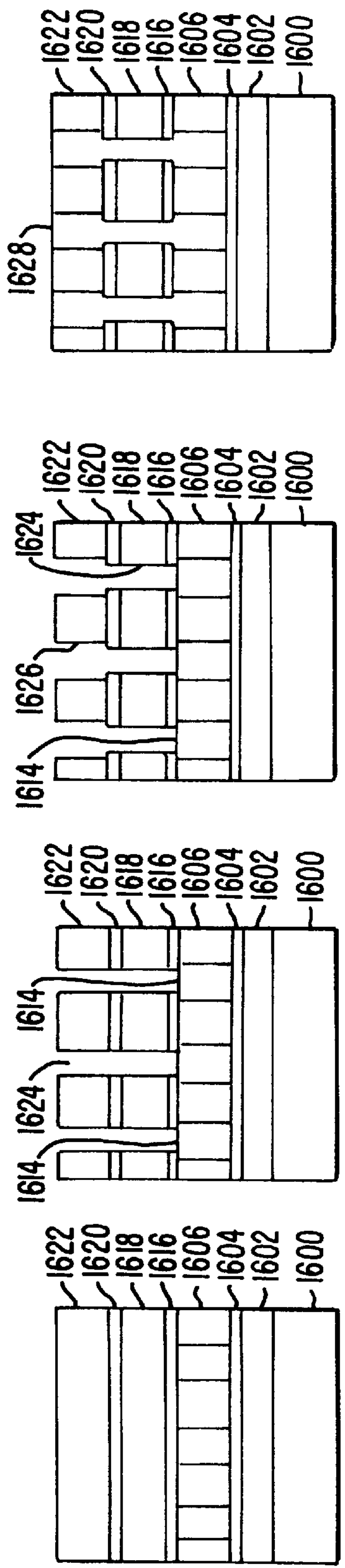
FIG. 16E.
FIG. 16F.
FIG. 16G.
FIG. 16H.

SURFACE TREATMENT OF C-DOPED $SiO_2$ FILM TO ENHANCE FILM STABILITY DURING $O_2$ ASHING

CROSS REFERENCE TO RELATED APPLICATIONS

The instant application claims priority as a divisional application from U.S. patent application Ser. No. 09/633,495, filed Aug. 7, 2000. This application is related to concurrently filed U.S. application Ser. No. 09/625,911, entitled "THERMAL CVD PROCESS FOR DEPOSITING A LOW DIELECTRIC CONSTANT CARBON-DOPED SILICON OXIDE FILM," having Li-Qun Xia, Fabrice Geiger, Frederic Gaillard, Ellie Yieh and Tian Lim as coinventors; and to concurrently filed U.S. application Ser. No. 09/633,196, entitled "METHOD AND APPARATUS TO ENHANCE PROPERTIES OF Si—O—C LOW K FILMS," having Li-Qun Xia, Frederic Gaillard, Ellie Yieh and Tian H. Lim as coinventors; and to concurrently filed U.S. application Ser. No. 09/632,669, entitled "POST-DEPOSITION TREATMENT TO ENHANCE PROPERTIES OF Si—O—C LOW K FILMS," having Li-Qun Xia, Frederic Gaillard, Ellie Yieh and Tian H. Lim as coinventors; and to concurrently filed U.S. application Ser. No. 09/633,798, entitled "LID COOLING MECHANISM FOR OPTIMIZED DEPOSITION OF LOW-K DIELECTRIC USING TRI METHYLSILANE-OZONE BASED PROCESSES," having Himansu Pokharna, Li-Qun Xia and Tian-Hoe Lim as coinventors. Each of the Ser. Nos. 09/625,911, 09/633,196, 09/632,669, and 09/633,798 applications listed above are assigned to Applied Materials, Inc., the assignee of the present invention and each of the above-referenced applications are hereby incorporated by reference.

BACKGROUND OF THE INVENTION

The present invention relates to the formation of dielectric layers during fabrication of integrated circuits on semiconductor wafers. More particularly, the present invention relates to a method for providing a dielectric film having a low dielectric constant that is particularly useful as a premetal or intermetal dielectric layer.

One of the primary steps in the fabrication of modern semiconductor devices is the formation of a thin film on a semiconductor substrate by chemical reaction of gases. Such a deposition process is referred to as chemical vapor deposition or "CVD." Conventional thermal CVD processes supply reactive gases to the substrate surface where heat-induced chemical reactions take place to produce a desired film. Plasma enhanced CVD techniques, on the other hand, promote excitation and/or dissociation of the reactant gases by the application of radio frequency (RF) or microwave energy. The high reactivity of the released species reduces the energy required for a chemical reaction to take place, and thus lowers the required temperature for such PECVD processes.

Semiconductor device geometries have dramatically decreased in size since such devices were first introduced several decades ago. Today's fabrication plants are routinely producing devices having 0.25 $\mu$m and even 0.18 $\mu$m feature sizes, and tomorrow's plants soon will be producing devices having even smaller geometries. In order to further reduce the size of devices on integrated circuits, it has become necessary to use conductive materials having low resistivity and insulators having a low dielectric constant. Low dielectric constant films are particularly desirable for premetal dielectric (PMD) layers and intermetal dielectric (IMD) layers to reduce the RC time delay of the interconnect metalization, to prevent cross-talk between the different levels of metalization, and to reduce device power consumption. Undoped silicon oxide films deposited using conventional CVD techniques may have a dielectric constant (k) as low as about 4.0 or 4.2. One approach to obtaining a lower dielectric constant is to incorporate fluorine in the silicon oxide film. Fluorine-doped silicon oxide films (also referred to as fluorine silicate glass or—"FSG" films) may have a dielectric constant as low as about 3.4 or 3.6. Despite this improvement, films having even lower dielectric constants are highly desirable for the manufacture of integrated circuits using geometries of 0.18 $\mu$m and smaller. Numerous films have been developed in attempts to meet these needs including: a spin-on glass called HSQ (hydrogen silsesquioxane, $HSiO_{1.5}$) and various carbon-based dielectric layers, such as parylene and amorphous fluorinated carbon. Other low-k films have been deposited by CVD using an organosilane precursor and oxygen to form a silicon-oxygen-carbon (Si—O—C) layer.

While the above types of dielectric films are useful for some applications, manufacturers are always seeking new and improved methods of depositing low-k materials for use as IMD and other types of dielectric layers. For example, in some applications, Si—O—C low-k films that have been deposited in accordance with the pre-deposition, deposition, post deposition, and curing processes described above are often subject to oxidizing environments in the course of subsequent processing. Such oxidizing processes include, but are not limited to, etching, photoresist strip and oxide capping processes. The low-k film is typically a silicon-oxy-carbon structure. In an oxidizing environment the low-k film can react with oxygen and hydrogen to form carbon dioxide ($CO_2$) and water vapor ($H_2O$). The reaction removes carbon from the film leading to shrinkage and increase in k-value.

SUMMARY OF THE INVENTION

The present invention provides a new and improved method for enhancing stability of thin films. In the method of the present invention a carbon-doped silicon oxide layer after is densified after deposition and curing. In one embodiment, the cured film is densified in a nitrogen-containing plasma. The substrate can be heated during plasma densification. The carbon-doped silicon oxide layer is generally deposited using a thermal, as opposed to plasma, CVD process. The method is particularly suitable for deposition of low dielectric constant films using methylsilane or di-, tri-, tetra-, or phenylmethylsilane and ozone. In one embodiment, the layer is deposited from a process gas of ozone and an organosilane precursor having at least one silicon-carbon (Si—C) bond. During deposition, the substrate is heated to a temperature less than about 250° C.

In some embodiments, the organosilane precursor has a formula of $Si(CH_3)_xH_{4-x}$ where x is either 3 or 4 making the organosilane precursor either trimethylsilane (TMS) or tetramethylsilane (T4MS). In other embodiments, the substrate over which the carbon-doped oxide layer is deposited is heated to a temperature of between about 100–200° C. and the deposition is carried out in a vacuum chamber at a pressure of between 1–760 Torr. In still other embodiments, the carbon-doped silicon oxide layer is cured after it is deposited to minimize subsequent moisture absorption. Curing can be done in either a vacuum or conventional furnace environment.

The method is particularly useful in the manufacture of sub-0.2 micron circuits as it can form a PMD or IMD film with a dielectric constant below 3.0. Films prepared in accordance with this process have good gap fill capabilities, high film stability and etch uniformly and controllably when subject to a chemical mechanical polishing (CMP) step.

The above method can be carried out in a substrate processing system having a process chamber; a substrate holder, a heater, a gas delivery system, and a power supply, all of which are coupled to a controller that operates under the direction of a computer program.

These and other embodiments of the present invention, as well as its advantages and features, are described in more detail in conjunction with the text below and attached figures.

BRIEF DESCRIPTION OF THE DRAWINGS

FIGS. 15*a*–15*h* depict a cross section of a partially formed integrated circuit undergoing integrated processing according to an embodiment of the present invention; and FIGS. 16*a*–16*h* depict a cross-section of a partially formed integrated circuit undergoing an integrated dual-damascene process according to an embodiment of the present invention.

DESCRIPTION OF THE SPECIFIC EMBODIMENTS

I. Exemplary CVD System

Figure 1A:
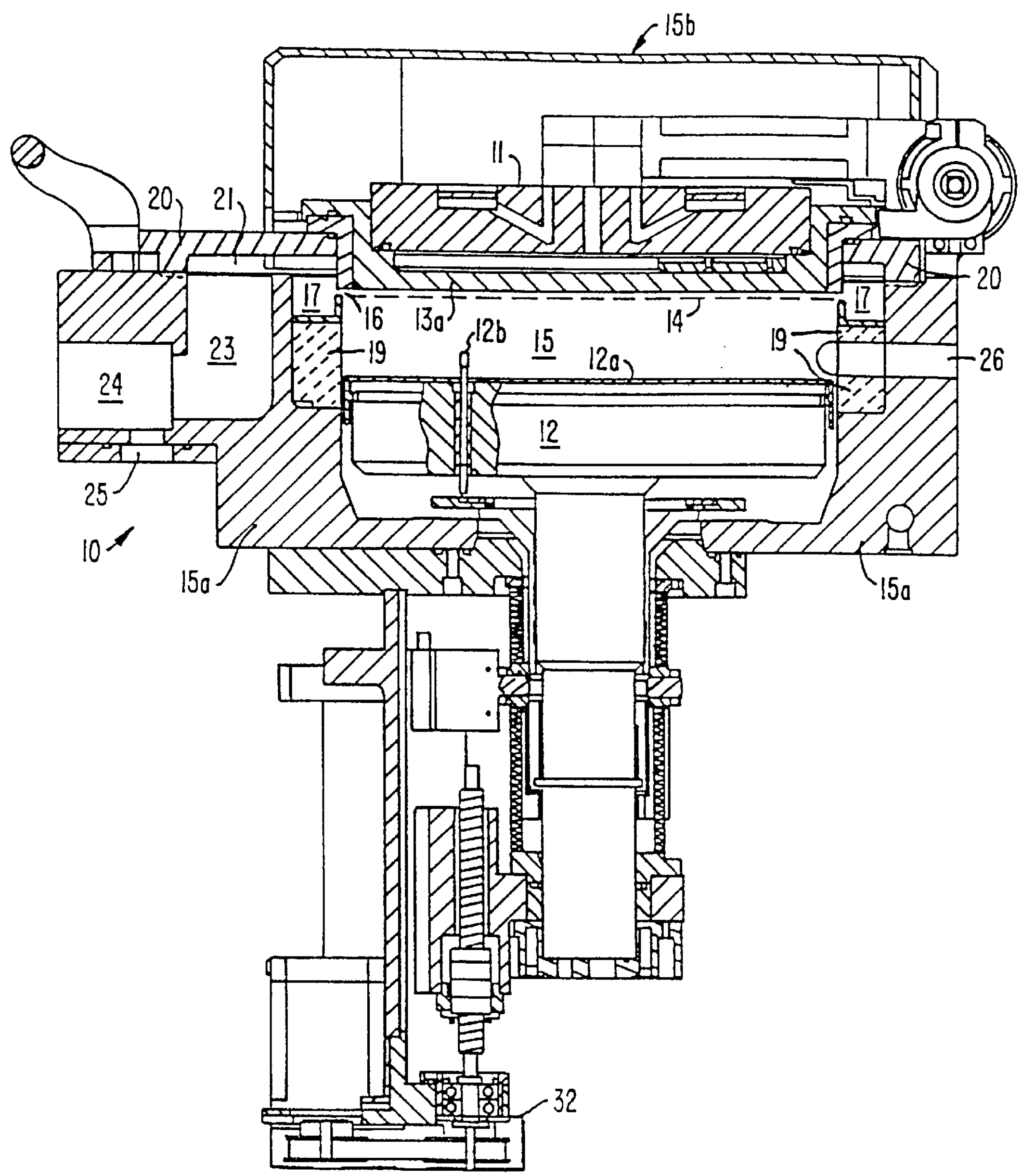
FIGS. 1A and 1B are vertical, cross-sectional views of one embodiment of a chemical vapor deposition apparatus according to the present invention.
Figure 1B:
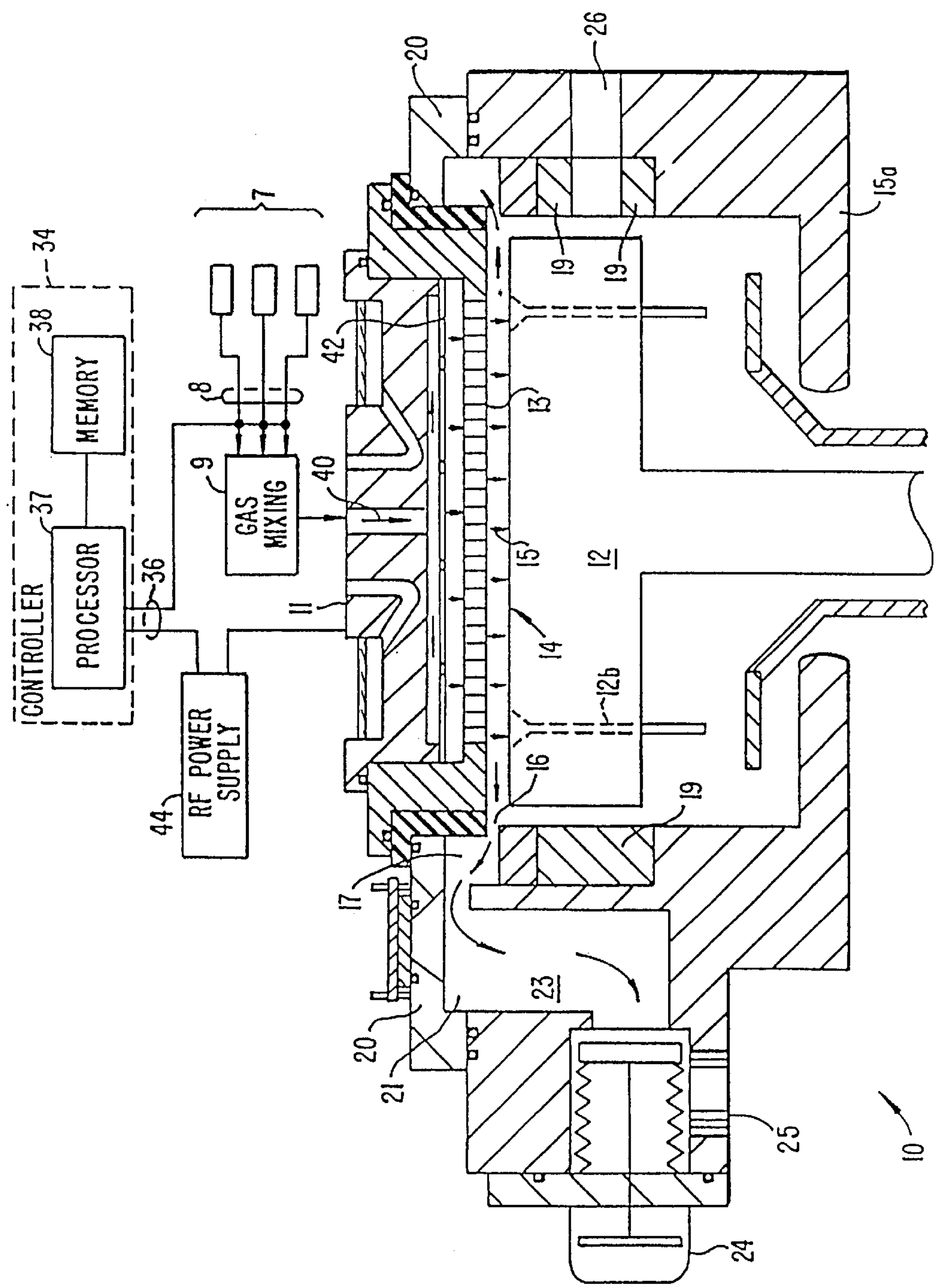
Figure 1C:
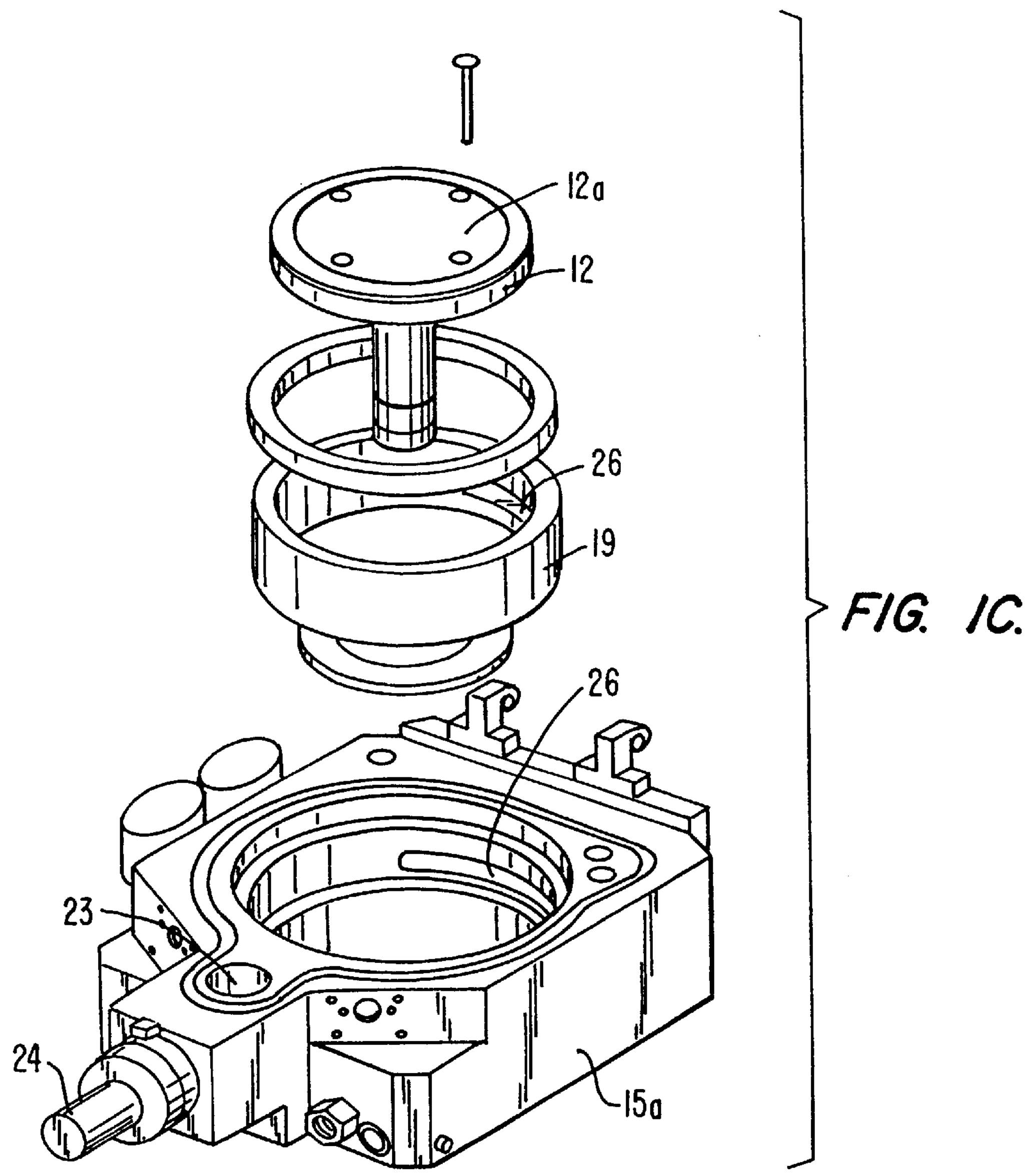
FIGS. 1C and 1D are exploded perspective views of parts of the CVD chamber depicted in FIG. 1A.
Figure 1D:
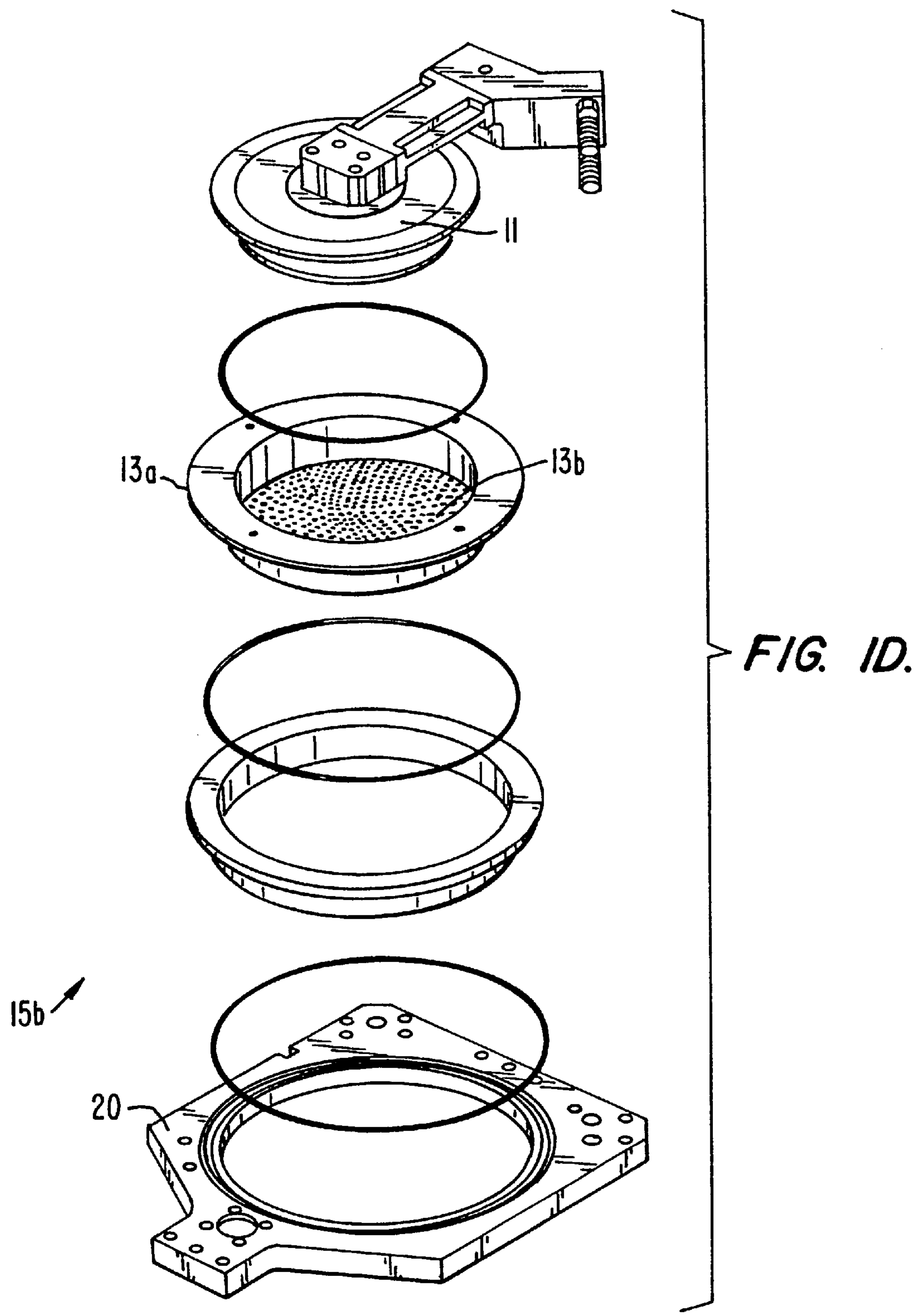

One suitable CVD apparatus in which the method of the present invention can be carried out is shown in FIGS. 1A and 1B, which are vertical, cross-sectional views of a CVD system 10, having a vacuum or processing chamber 15 that includes a chamber wall 15*a* and chamber lid assembly 15*b*. Chamber wall 15*a* and chamber lid assembly 15*b* are shown in exploded, perspective views in FIGS. 1C and 1D.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12*a* of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13*b* (FIG. 1D) of a conventional flat, circular gas distribution or faceplate 13*a*. More specifically, deposition process gases flow into the chamber through the inlet manifold 11 (indicated by arrow 40 in FIG. 1B), through a conventional perforated blocker plate 42 and then through holes 13*b* in gas distribution faceplate 13*a*.

Before reaching the manifold, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13*a* and the pedestal so as to excite the process gas mixture to form a plasma within the cylindrical region between the faceplate 13*a* and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 450 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a thermal deposition process, a heat transfer liquid is circulated through the walls 15*a* of the process chamber to maintain the chamber at a constant temperature to prevent condensation of liquid precursors and reduce gas phase reactions that could create particles. A portion of these heat-exchanging passages in the lid of chamber 15 (passages 18) is shown in FIG. 1B. The passages in the remainder of chamber walls 15*a* are not shown. Fluids used to heat the chamber walls 15*a* include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side-wall 15*a* (including the upper dielectric lining 19 on the wall) and the bottom of the circular chamber lid 20. The 360° circular symmetry and uniformity of the slot orifice 16 and the plenum 17 help achieve a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15*a*), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12. Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12*b* as wafers are transferred into and out of the body of the chamber by a robot blade (not shown) through an insertion/removal opening 26 in the side of the chamber 15. The motor 32 raises and lowers pedestal 12 between a processing position 14 and a lower, wafer-loading position. The motor, valves or flow controllers connected to the supply lines 8, gas delivery system, throttle valve, RF power supply 44, and chamber, substrate heating system and heat exchangers H1, H2 are all controlled by a system controller 34 (FIG. 1B) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 1E:
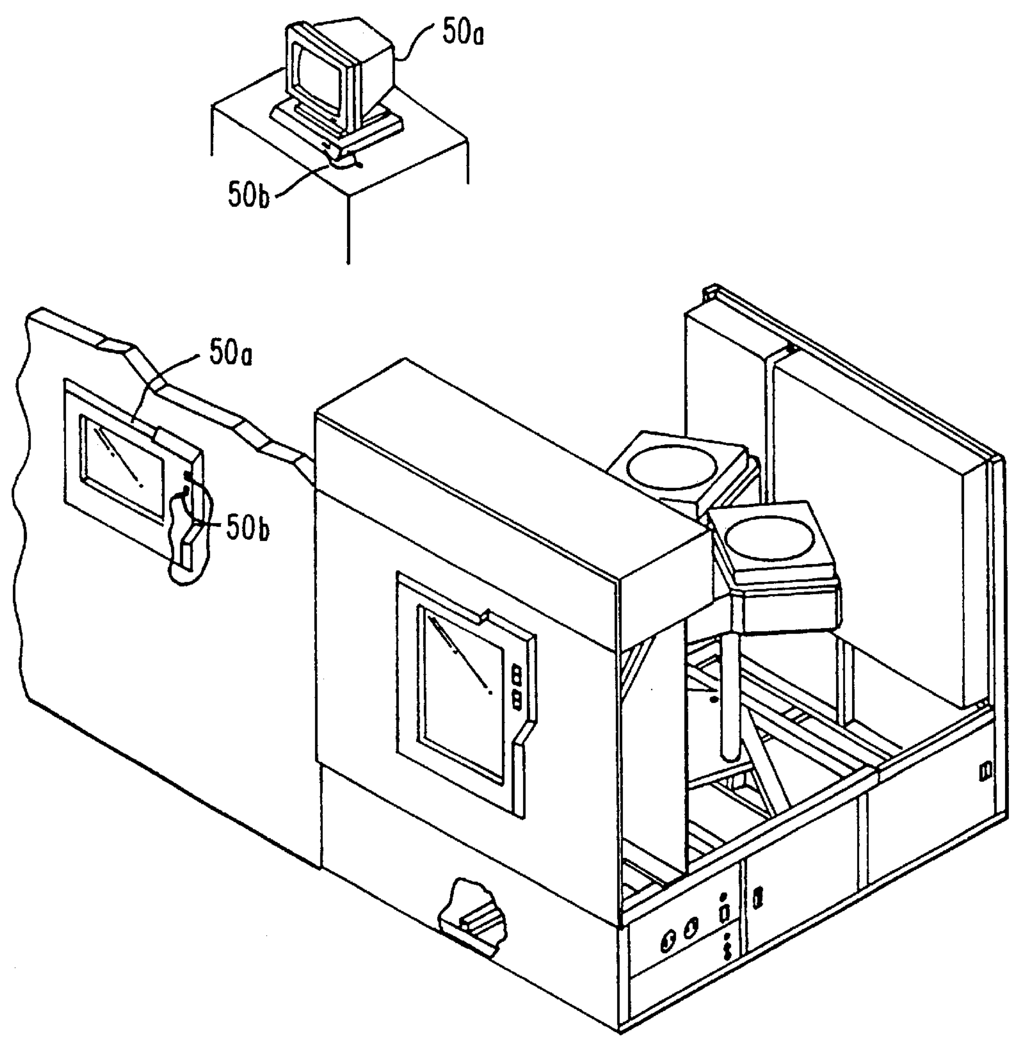
FIG. 1E is a simplified diagram of system monitor and CVD system 10 in a multi-chamber system, which may include one or more chambers.

The interface between a user and controller 34 is via a CRT monitor 50*a* and light pen 50*b*, shown in FIG. 1E, which is a simplified diagram of the system monitor and CVD system 10 in a substrate processing system, which may include one or more chambers. In the preferred embodiment two monitors 50*a* are used, one mounted in the clean room wall for the operators and the other behind the wall for the service technicians. The monitors 50*a* simultaneously display the same information, but only one light pen 50*b* is enabled. A light sensor in the tip of light pen 50*b* detects light emitted by CRT display. To select a particular screen or function, the operator touches a designated area of the display screen and pushes the button on the pen 50*b*. The touched area changes its highlighted color, or a new menu or screen is displayed, confirming communication between the light pen and the display screen. Other devices, such as a keyboard, mouse, or other pointing or communication device, may be used instead of or in addition to light pen 50*b* to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines.

To execute the linked, compiled object code the system user invokes the object code, causing the computer system to load the code in memory. The CPU then reads and executes the code to perform the tasks identified in the program.

Figure 1F:
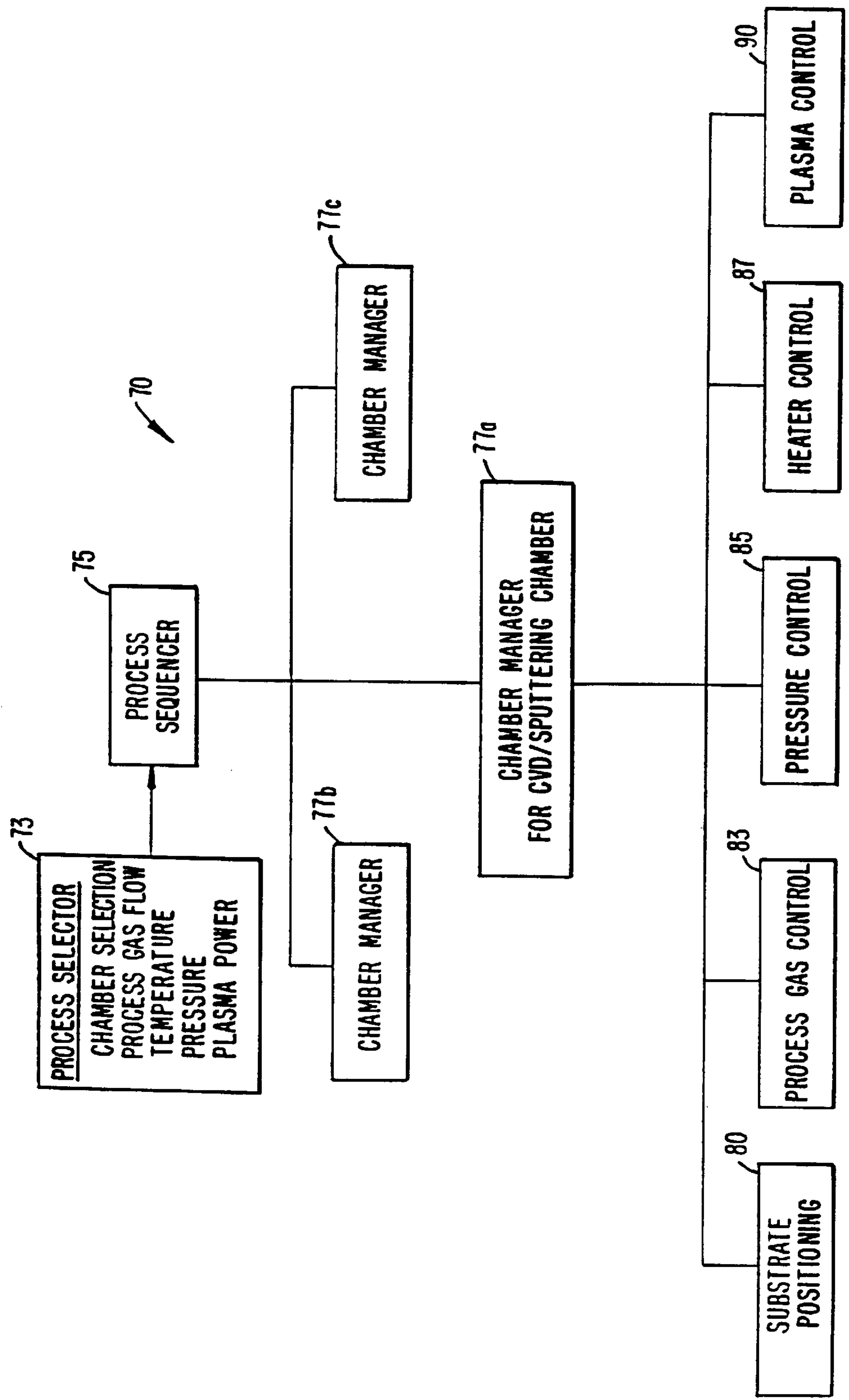
FIG. 1F shows an illustrative block diagram of the hierarchical control structure of the system control software, computer program 70, according to a specific embodiment.

FIG. 1F is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77*a–c*, which controls multiple processing tasks in a process chamber 15 according to the process set determined by the sequencer subroutine 75. For example, the chamber manager subroutine 77*a* comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77*a* selectively schedules or calls the process component subroutines in accordance with the particular process set being executed. The chamber manager subroutine 77*a* schedules the process component subroutines much like the sequencer subroutine 75 schedules which process chamber 15 and process set are to be executed next. Typically, the chamber manager subroutine 77*a* includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77*a*.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77*a*, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77*a*, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and dilute the reactant so that there is a uniform reaction. Then the steps described above would be carried out. Additionally, when a process gas is to be vaporized from a liquid precursor, for example, tetraethylorthosilane ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77*a*. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20 and/or the heat exchanger. The heater control subroutine 87 is also invoked by the chamber manager subroutine 77*a* and receives a target, or set-point, temperature parameter. The heater control subroutine 87 measures the temperature by measuring voltage output of a thermocouple located in pedestal 12 chamber 15, or lid assembly 15*a*, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When, for example, an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15 and for setting the low frequency RF frequency employed. Similar to the previously described chamber component subroutines, the plasma control subroutine 90 is invoked by the chamber manager subroutine 77*a*.

The above reactor description is mainly for illustrative purposes, and other thermal CVD equipment such as the Giga-fill chamber manufactured by Applied Materials may be employed. Additionally, variations of the above-described system, such as variations in pedestal design, heater design, RF power frequencies, location of RF power connections and others are possible. For example, the wafer could be supported by a susceptor and heated by quartz lamps. The method of the present invention is not limited to any specific CVD apparatus.

II. Exemplary Deposition of an IMD Layer

Certain embodiments of the present invention relate to deposition of a carbon-doped silicon oxide low K film using a thermal CVD process. Other embodiments of the present invention enhance the adhesion and stability of thin films including carbon-doped silicon oxide films deposited from an ozone/organosilane precursor gas according the method discovered by the present inventors. Embodiments of the invention can be practiced in a CVD deposition chamber such as the exemplary chamber described above. Embodiments of the present invention related to the deposition of a low k thermal CVD carbon-doped silicon oxide film are particularly useful for the deposition of premetal and intermetal dielectric layers (sometimes referred to as interlevel dielectric layers), especially those used for sub-0.2 micron applications.

Figure 3:
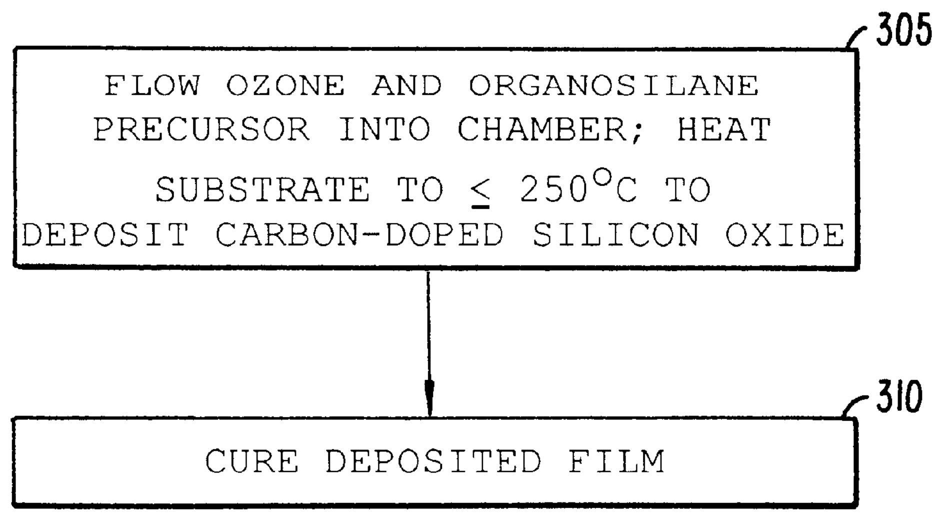
FIG. 3 is a flowchart illustrating the formation of a carbon-doped silicon oxide layer according to one embodiment of the method of the present invention.

FIG. 3 is a flowchart illustrating the formation of a carbon-doped silicon oxide layer according to one embodiment of the present invention. As shown in FIG. 3, the film is deposited by flowing an organosilane precursor gas and ozone into a substrate processing chamber and heating the substrate within the chamber to a temperature less than about 250° C. (step 305). The deposition process is a thermal, as opposed to plasma, CVD process. After the film is deposited, it is then cured (step 310) to form a stable polymeric structure and increase its resistance to moisture absorption. In order to form a film having a sufficiently low dielectric constant, it is important that the organosilane precursor gas used for film deposition have at least one silicon-carbon bond. Examples of such precursor gases include methylsilane, dimethylsilane (DMS), trimethylsilane (TMS), tetramethylsilane (T4MS) and phenylmethylsilane among others. Because of their commercial availability and high number of silicon-carbon bonds, TMS and T4MS are the currently most preferred precursor gases. Further details of the preferred deposition process conditions and preferred curing processes are discussed in detail below.

The present inventors have found that the dielectric constant of carbon-doped silicon oxide film deposited in step 305 is directly related to the temperature of the substrate during deposition. In order to deposit a film having a dielectric constant that is sufficient for low k applications (e.g., a k less than or equal to 3.0), it is important that the deposition temperature be kept below 250° C. Temperatures lower than 250° C. are preferred in other embodiments.

As used herein "deposition temperature" refers to the temperature of the substrate during deposition. In the currently preferred embodiments, the substrate is directly heated by the pedestal heater. At higher pressures, e.g., 200 Torr and above, the substrate temperature is practically equal to the pedestal temperature (substrate temperature may be about 10° C. less) due to conduction and convection heating. At near vacuum pressures, however, (e.g., less than 50 Torr) there may be a 50–60° C. temperature difference between the substrate and pedestal because of the lack of convection heating. Thus, at these lower pressure levels, the pedestal temperature can be set up to 50–60° C. higher than the desired deposition temperature.

Figure 4:
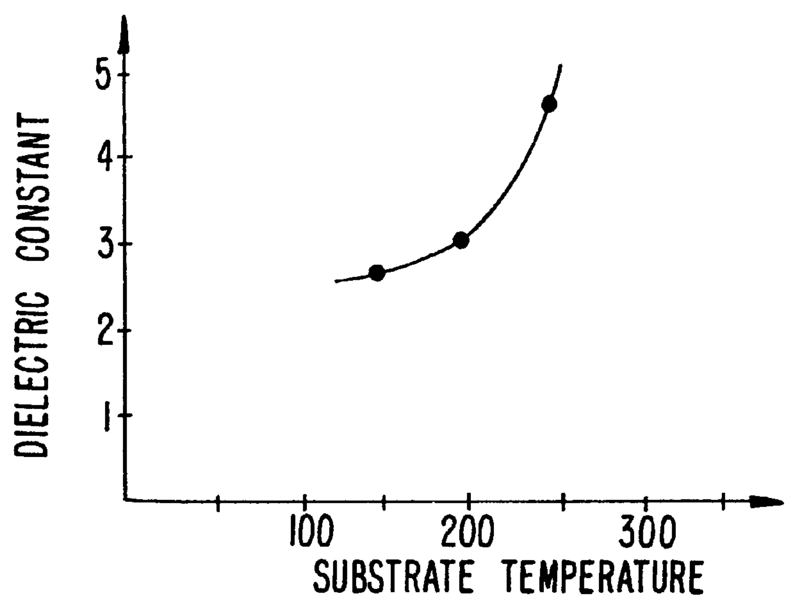
FIG. 4 is a graph of substrate temperature versus dielectric constant for a carbon-doped silicon oxide film deposited in accordance with a particular embodiment of the present invention.

FIG. 4 is a graph showing the effect of temperature on dielectric constant for a particular set of deposition conditions at a deposition pressure above 200 Torr. As shown in FIG. 4, a pedestal temperature of 250° C. resulted in a dielectric constant of 4.6 while pedestal temperatures of 200° C. and 150° C. resulted in dielectric constants of 3.0 and 2.7 respectively. Thus, as evident from the figure and from other tests the inventors ran, a temperature of 200° C. and below is preferred. It is believed that the deposition temperature has a direct effect on the amount of carbon incorporated into the deposited film. Silicon oxide films having higher carbon concentration levels generally have a lower dielectric constant than silicon oxide films having lower carbon levels, other dopant concentrations being similar. Films deposited according to the present invention preferably have a carbon content of at least 8 atomic percent and more preferably at least 10 atomic percent.

Figure 5:
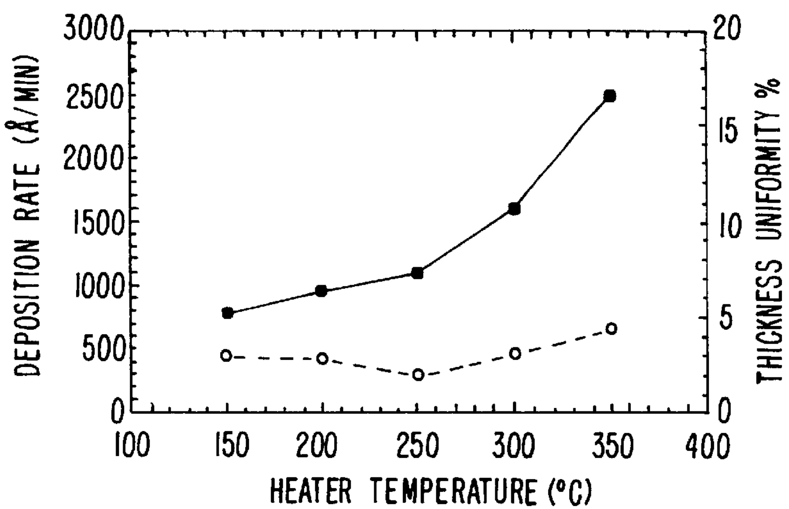
FIG. 5 is a graph showing the effect of substrate temperature on deposition rate for a carbon-doped silicon oxide film deposited in accordance with a particular embodiment of the present invention.

Deposition temperature is also important, however, in achieving gas phase reactions between ozone and the organosilane precursor. Ozone activates through these gas phase collisions and a sufficiently high temperature is required to ensure a commercially acceptable deposition rate. Thus, while it is important to have a sufficiently low deposition temperature to obtain an appropriate low dielectric constant, this must be balanced against deposition rate. FIG. 5 is a graph showing the effect of pedestal temperature on deposition rate. For FIG. 5 a carbon-doped silicon oxide film was deposited at a pressure of 200 Torr and spaced 250 mils from the gas distribution manifold. A process gas of TMS (170 sccm), 12.5 wt. % ozone (1000 sccm and helium (6000 sccm) was flowed into the chamber and the pedestal temperature was varied from 150° C. to 350° C. As shown in FIG. 5, deposition rate increases as the pedestal temperature is increased. The activation energy of the reaction, however, is only 3.8 kcal/mol, indicating that the reaction controlling step is in the gas phase. In order to achieve a commercially acceptable deposition rate for IMD and PMD applications, it is useful to maintain the pedestal temperature at about 100° C. or above. In another set of experiments and tests, the deposition rate of carbon-doped silicon oxide films was measured for pedestal temperature of 100° C., 150° C. and 200° C. In these tests, the 200° C. process had a deposition rate of about 1000 Å/min and the 150° C. process had a rate of about 500 Å/min. Below 100° C., however, the process had a deposition rate of about 50 Å/min—a rate that is currently considered too low for practical commercial applications as an IMD or PMD layer. At deposition temperatures sufficiently below 100° C. ozone may not be activated and deposition may not occur at all.

A technique the inventors have devised to increase the deposition rate at a given pedestal temperature concerns heating at least the upper portion of the substrate processing chamber with the heat exchanger (the temperature controlled liquid that circulates through passages in the chambers walls described in the exemplary chamber section). In most conventional TEOS/ozone IMD deposition applications, the substrate is heated to a temperature of at least 400° C. In a cold wall reactor this heating is done primarily by heating the substrate directly (i.e., with a heated pedestal). At such a relatively high deposition temperature, the effect of the heat exchanger on the deposition process is minimal. That is, the heat exchanger cannot alter process conditions in any significant manner to be thought of as an additional "control knob" for the process.

The present inventors, however, have determined that because of the relatively low substrate temperatures that are preferred for the present invention, the heat exchanger can have a significant effect on deposition rate. Specifically, the heat exchanger can be used as an additional "control knob" to increase the deposition rate of the carbon-doped silicon oxide film. The inventors have determined that heating the glycol/water mixture to a temperature above the normally recommended temperature of 65° C. helps activate ozone in the gas phase, which in turn leads to an increased deposition rate for the growing film, a lower dielectric constant and better gap fill properties. Other embodiments of the invention, use the heat exchanger to heat the glycol/water mixture to between 55 and 100° C.

In previously known systems only a single heat exchanger and heat exchange loop was coupled to passages 18*a* and passages 18*b*. Therefore, the walls 15*a* and lid 15*b* were kept at approximately the same temperature. Since the temperature was chosen to optimize the deposition reaction in the chamber 15, organosilane precursor tended to react behind the blocker plate 42 in such a way as to choke off the flow of gas through the gas distribution manifold 11. To, overcome this, the deposition chamber can be configured to provide separate control of the temperature of the chamber walls and the temperature of the chamber lid assembly. In one embodiment, depicted in FIG. 2, chamber 15 is equipped with two heat exchangers H1 and H2 coupled to separate heat exchange loops L1 and L2 respectively. Heat exchangers H1 and H2 mechanisms for transfer of thermal energy to or from heat transfer medium, such as fluids circulating in heat exchange loops L1 and L2. Such thermal energy transfer can heat the fluid, e.g., resistively, conductively, convectively, radiatively or by exothermic chemical reaction. Alternatively, such thermal energy transfer can cool the fluid, e.g., conductively, convectively, radiatively, evaporatively, by Peltier effect or by endothermic chemical reaction.

Heat exchange loop L1 is coupled to passages 18*a* in the walls 15*a* of chamber 15. Heat exchange loop L2 is coupled to passages 18*b* in lid assembly 15*b*, e.g., in gas distribution manifold 11. Loop L1 and L2 are not fluidly coupled to each other. Thus it is possible, for example to heat walls 15*a* while cooling lid assembly 15*b*. This is useful when, for example, it is desired to optimize the reaction occurring within chamber 15, while at the same time inhibiting reaction of reactants in gas distribution manifold, e.g., behind blocker plate 42. A specific example of a suitable heat exchanger H1 is an AMAT-0 unit, manufactured by Applied Materials of Santa Clara. Such a heat exchanger unit is generally capable of maintaining the chamber walls 15*a* at between 45 and 100° C. A specific example of heat exchanger H2 is a refrigerated bath unit model AMAT RTE-140, manufactured by NESLAB of Portsmouth, N.H. Such a unit is generally capable of maintaining the 15*b* at a temperature of between −40 and 100° C. Both units use a 50—50 mixture of glycol and water as a heat transfer medium.

In one embodiment, heater control subroutine maintains the chamber walls 15*a* at a temperature of approximately 60° C. and lid assembly 15*b* at a temperature of approximately 25° C. during deposition of a low-k material with an organosilane precursor. Operating the system in this manner inhibits thermal reaction of the precursor behind the blocker plate 42 and prevents choking of the flow of gas through the gas distribution manifold 11. Consequently, the deposition rate can be substantially increased compared to deposition performed with a single heat exchanger coupled to both lid assembly 15*b* and walls 15*a*. Heater control subroutine 87 can be configured to separately control heat exchangers H1 and H2.

Figures 6A, 6B:
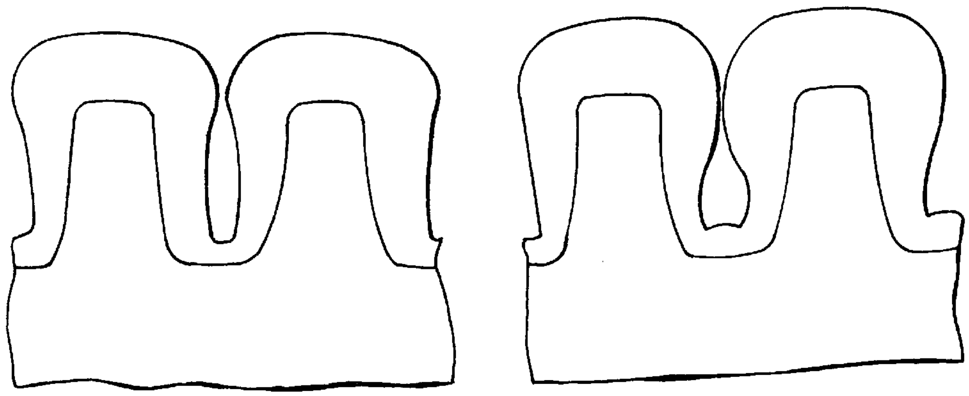
FIGS. 6A–C are drawings illustrating the gap fill capabilities of films deposited according to the present invention at deposition temperatures of 150–250° C.
Figure 6C:
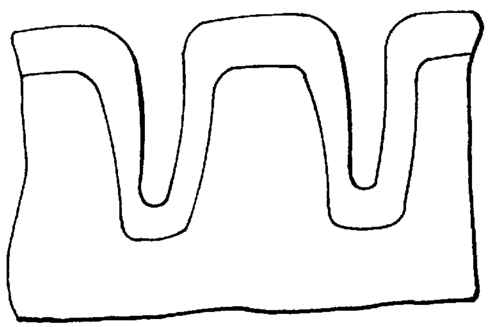

The inventors have also determined that the gap fill properties of the carbon-doped silicon oxide film deposited according to the present invention are better at lower substrate deposition temperatures as compared with higher deposition temperatures. FIGS. 6A–C are sketches showing the cross-sectional view of a film deposited according to the present invention over adjacent raised surfaces. FIG. 6A shows a film deposited at a pedestal temperature of 250° C., while the film in FIG. 6B was deposited at 200° C. and the film in FIG. 6C was deposited at 150° C. As shown in the figures, the gap fill capability of the 150° C. film is significantly better than the higher temperature films. Higher wall temperatures, however, improve the gap fill properties of the film. Specifically, in a dual heat exchange systems higher settings of heat exchange H1 operatively coupled to the walls encircling the substrate raise the wall temperatures. It is believed that these improved properties are due to the effect the heat exchanger has on ozone activation in the gas phase. Increasing the wall temperature leads to an increase in the gas phase temperature as well as an increase in ozone decomposition in the gas phase reaction.

While the overall deposition pressure can be varied between 1–760 Torr to help obtain desired film properties, it is important that the partial pressure of the organosilane precursor be kept below its vapor pressure in the deposition environment. The formula for partial pressure of the organosilane precursor is set forth as formula (1) below:

$$(\text{Organosilane Flow}/\text{Total Gas Flow})\times\text{Chamber Pressure} \quad (1)$$

As evident from the above equation, the flow rate of the organosilane gas is limited by its partial pressure. The flow rate of the organosilane gas has a direct effect on the film deposition rate. It is generally desirable to introduce as much of the organosilane as possible in order to ensure a sufficiently high deposition rate. As would be known to those of skill in the art, the chemical supplier, e.g., a company such as Dow Corning, can provide a list of recommended maximum gas flows at various pressures for organosilane precursors (e.g., TMS) that they supply.

In some embodiments it is preferred that deposition pressure be set above about 50 Torr and below about 450 Torr. Higher pressures generally increase the gas phase reactions of the ozone/organosilane reaction. It is desirable that the gas phase reactions result in a final product (carbon-doped silicon oxide) being formed on the surface of the substrate. If the gas phase reaction is too strong (e.g., at a pressure level about 450 Torr), final product may be formed in the gas phase above the substrate surfaces rather than on the surface. Pressures above 50 Torr are generally desirable to promote good heat transfer between the substrate and pedestal and to achieve good gap fill performance characteristics.

The ozone flow rate also has a strong effect on deposition rate. Flowing more ozone into the chamber allows for more gas phase reactions between the ozone and the organosilane thereby increasing the rate of film deposition. Similarly, flowing a higher concentration of ozone, for example, 16 wt. % as opposed to 8 wt. %, also results in an increase in the deposition rate.

Preferred embodiments of the present invention also introduce an inert gas flow, in addition to the organosilane and ozone precursor gas flows, into the chamber during the deposition process. The inert gas flow helps stabilize the deposition process and improves the thickness uniformity of the deposited film. Currently preferred embodiments introduce a flow of helium as the inert gas, but other embodiments can introduce other gases such as argon or nitrogen. The inert gas should not include elements that incorporate into the film in any significant manner.

Figure 7:
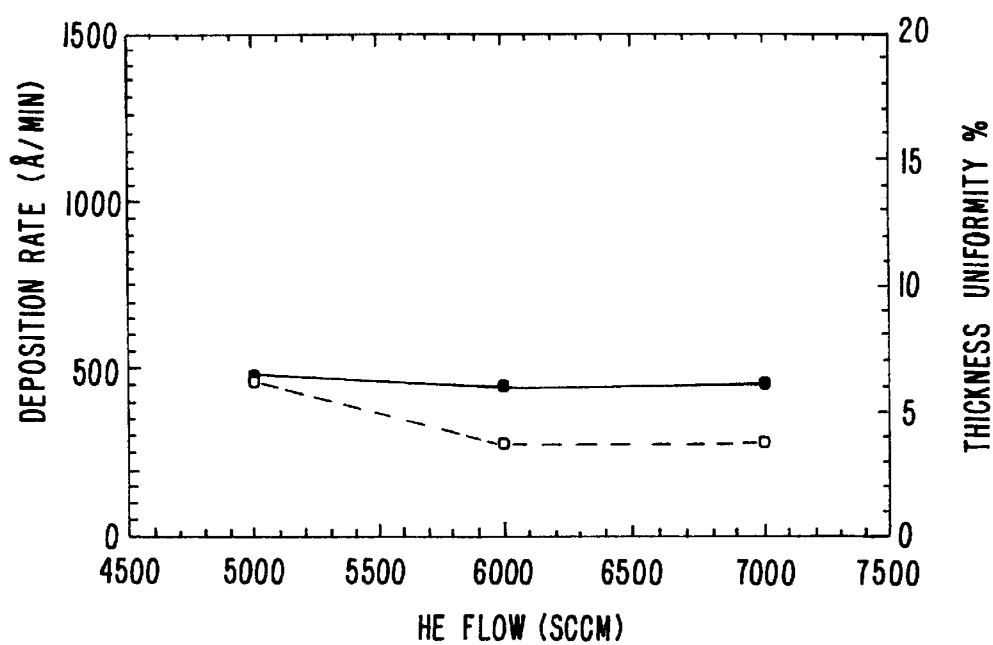
FIG. 7 is a graph showing the effect of an inert gas flow of helium on film uniformity in a carbon-doped silicon oxide film deposited according to the present invention.

FIG. 7 is a graph showing the effect of an inert gas flow of helium on film uniformity. As evident by FIG. 7, the inventors have determined that a high flow of helium improves film uniformity, but once the flow reaches a certain rate, 6000 sccm for this particular set of deposition conditions, a further increase in the inert gas flow does not further improve film uniformity. The addition of a high flow of helium does not adversely affect other film qualities such as deposition rate or refractive index.

Higher deposition pressure levels generally result in better gap fill properties but lower deposition rate and dielectric constants. Thus, it is important to balance these resulting characteristics depending on the desired physical properties of the deposited film. In one set of experiments, in which the pedestal temperature was set to 200° C., the heat temperature of a single exchanger coupled to both the lid and walls was set to 55° C., spacing was set to 210 mils and a process gas of TMS (170 sccm), helium (6000 sccm) and 12.5 wt. % ozone (4000 sccm) was introduced, pressure was set to 50 Torr and then to 200 Torr. At 50 Torr the film had a deposition rate of 978 Å/min and a k of 2.58. At 200 Torr the film had a deposition rate of 831 Å/min and a k of 2.69. The gap fill properties of the 200 Torr film were improved as compared to the 50 Torr film, however.

One experiment was performed in a chamber wherein separate heat exchangers were configured to maintain the walls at approximately 55° C. and the lid assembly at about 25° C. The other deposition conditions were approximately the same as in the previous example, however the film had a deposition rate of approximately 1700 Å/min at a pressure of 100 torr.

The present inventors have found that, subsequent to film deposition, a film cure step (FIG. 3, step 310) can improve film stability, especially if the deposited film is subject to an environment, e.g., the clean room ambient, that contains moisture. Such a cure process forces out moisture already absorbed into the film and changes the film structure so that it is more moisture resistant. The cure process removes undesirable Si—O "cage like" bonds and replaces them with the more desirable Si—O "network" type bonds as would be understood by a person of skill in the art.

Figure 8A:
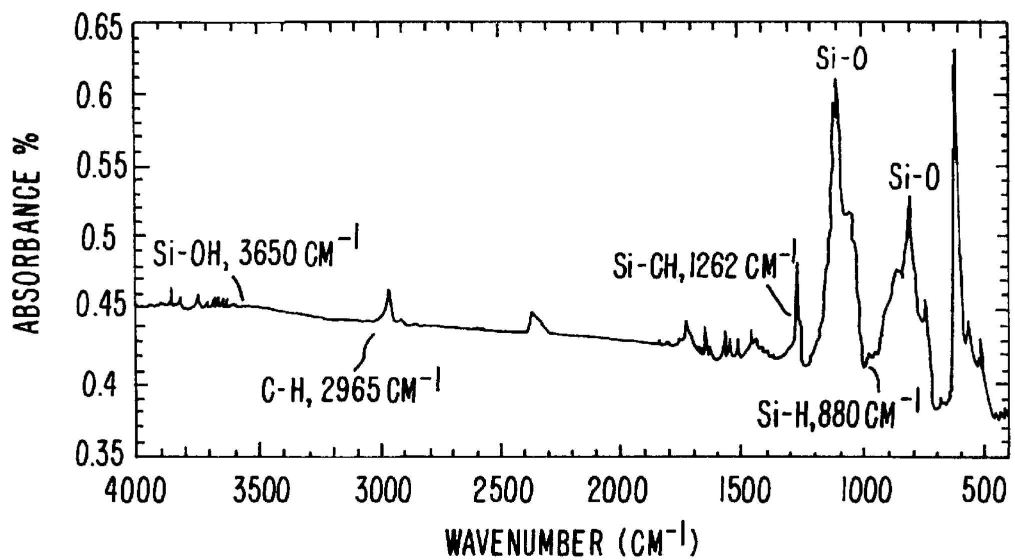
FIGS. 8A and 8B are graphs of FTIR data that compare the crystalline orientation of a carbon-doped silicon oxide film deposited and cured according to the present invention with an uncured film.
Figure 8B:
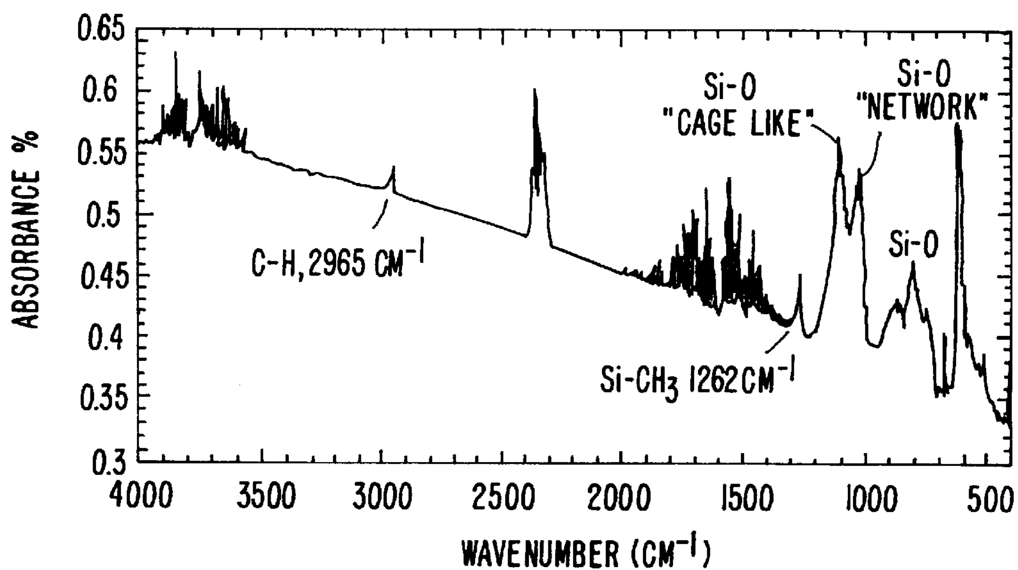

FIGS. 8A and 8B compare a cured carbon-doped silicon oxide film with uncured film. FIG. 8A shows Fourier transform infrared spectrometry (FTIR) data of an as deposited carbon-doped silicon oxide film deposited from TMS, ozone and helium precursor gas mixture. As shown in FIG. 8A, the film contains a relatively high number of Si—O cage-like bonds (wavenumber 1150 $cm^{-1}$) and very few of the desirable Si—O network type bonds. The cage-like bonds have dangling bonds and are susceptible to attracting hydrogen atoms in the presence of moisture such as moisture vapor. As shown in FIG. 8B, once the film is cured, however, many of the Si—O cage-like bonds are converted to the network type bonds resulting in a more stable, highly moisture resistant film. The film deposited for the test shown in FIG. 8A also exhibited a strong stress hysteresis when heated and subsequently cooled and a high dielectric constant (k=5.5) due to moisture absorption when exposed to the ambient for a one week period. In contrast, the film deposited and cured for the test in FIG. 8B, exhibited no stress hysteresis when heated and subsequently cooled and retained a low dielectric constant (k=2.5) even when exposed to the ambient for a week.

Several different processes can be performed to effectively cure films deposited according to the present invention. Two process that should not be used, however, include an oxygen plasma cure or a cure in an ozone rich furnace environment. Such processes can result in oxygen atoms reacting with the deposited film and removing the highly desirable Si—C bonds. When this happens the dielectric constant of the film greatly increases and the film becomes unsuitable for applications requiring low dielectric constants.

Instead, the cure process can be performed in a conventional furnace with a relatively inert atmosphere, e.g., nitrogen, oxygen, or ammonia, or under vacuum conditions. In either case, the cure can be done in situ, i.e., without breaking vacuum, or ex situ, but ex situ processes are generally preferred since in situ processes require use of a relatively expensive deposition chamber and can significantly reduce throughput of the tool.

In either a conventional furnace or vacuum chamber, the cure process heats the film to a temperature between about 300–500° C. for at least about 10 minutes. Higher temperature cures generally take less time than lower temperature ones. For example, a 300° C. cure may last for 40–60 minutes while a 500° C. cure may last for 10–20 minutes.

In a specific embodiment, a vacuum cure heats the substrate to a temperature of about 400° C. for a period of about 10 minutes in a low pressure nitrogen environment. Such a process stabilizes the deposited film so that it resists moisture absorption in the future. The substrate may be transferred to another chamber, e.g. a different chamber in the same cluster tool as the deposition chamber, for curing without breaking vacuum. A specific embodiment of a conventional furnace cure also heats the substrate to a temperature of about 400° C. for a period of about 30 minutes in a nitrogen atmosphere.

Instead of placing the substrate in a vacuum environment, however, the substrate is placed in a molecular nitrogen ($N_2$) environment at atmospheric pressure. The furnace cure process is preferred to a vacuum cure in some embodiments because it achieves similar or even better film results with less expensive equipment and increased throughput. Throughput is increased because wafers can be transferred into and out of the furnace, which can heat multiple wafers at a time, one at a time as they have finished the curing cycle, e.g., 30 minutes. While a vacuum chamber can also heat and cure multiple wafers at a time, the wafers are loaded and unloaded in batches so as to not break vacuum while the curing process is underway.

Figure 9:
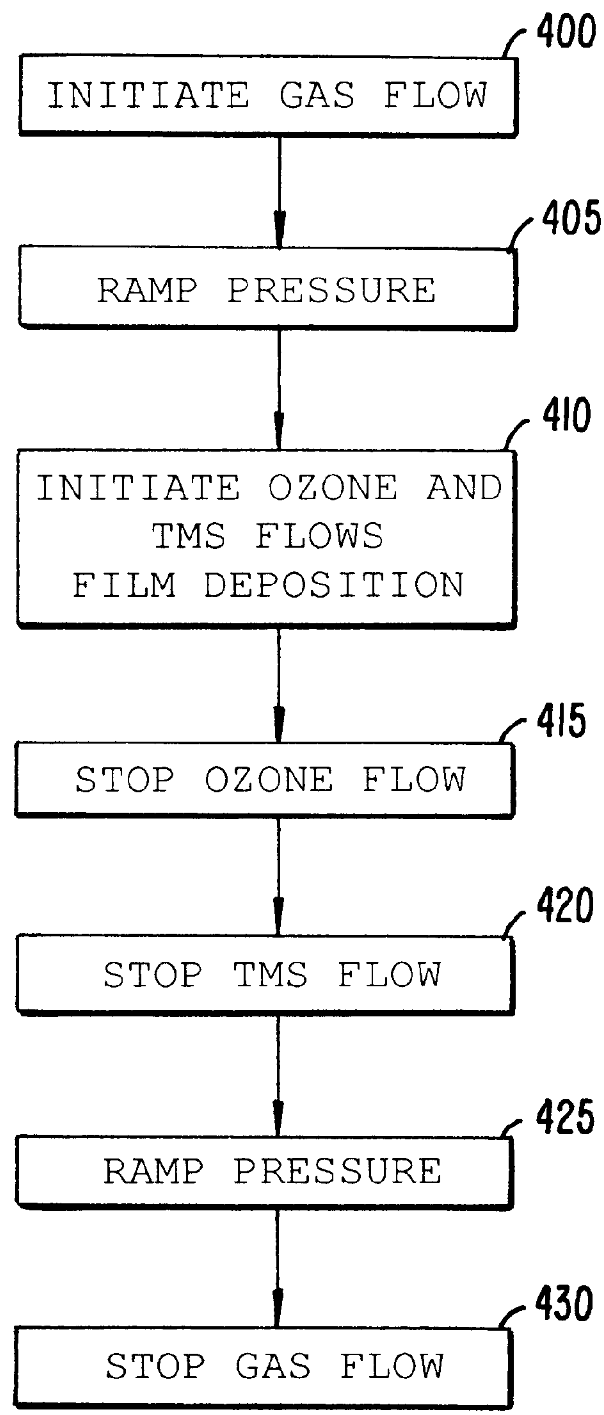
FIG. 9 is a flowchart of one process according to the present invention that employs a process gas of TMS, ozone and helium.

FIG. 9 is a flowchart of one embodiment of a thermal deposition process, shown in FIG. 3 as step 305, that employs a process gas of TMS, ozone and helium. The process set forth in FIG. 9 is for exemplary purposes only and should not be considered limiting to the scope of the present claims. The deposition process is initiated, after a wafer has been loaded into the deposition chamber, by flowing helium (6000 sccm) and oxygen (4000 sccm) gases while keeping the throttle valve fully open (step 400) for several seconds in order to stabilize the gas flows. Oxygen ($O_2$) is added to the helium flow at the same rate at which ozone is subsequently added. Flowing oxygen in this manner results in a substantially constant oxygen/helium ratio throughout the deposition process. It is believed that maintaining such a constant ratio improves film uniformity. An ozone flow is not introduced at this stage because the high reactivity of ozone.

Once the gas flow has stabilized, the throttle valve is partially closed and the pressure within the chamber is brought to the desired deposition pressure level in the presence of the helium and oxygen flows (step 405). Once the desired pressure level is reached and maintained for a couple of seconds, an ozone flow (4000 sccm) is substituted for the oxygen flow and a flow of TMS is initiated (500 sccm) to deposit a carbon-doped silicon oxide film (step 410). Deposition step 410 is maintained until the carbon-doped silicon oxide layer reaches a desired thickness and then the ozone flow is shut off (step 415). The ozone flow is switched off prior to the TMS flow in order to allow the TMS to react with residual ozone in the gas phase. The present inventors have determined that shutting off the ozone and TMS flows simultaneously can result in ozone reacting with carbon in the deposited film. The TMS flow is then shut off several seconds after the ozone flow (step 420) and the deposition pressure is released by opening the throttle valve while maintaining the helium flow (step 425). Finally, all the gases are shut off (step 430).

The pedestal and heat exchanger temperatures are set and stabilized prior to film deposition. All three temperatures are maintained approximately constant throughout deposition. In the above example, both the walls and lid of the deposition chamber were maintained at a temperature of about 55° C. Generally these temperatures are set and remain unchanged throughout an entire run of multiple wafer depositions.

In an alternative embodiment, the chamber walls are maintained at a temperature of about 60° C. and lid assembly is maintained at about 25° C. In this embodiment the helium flow rate is 8000 sccm and the oxygen flow rate is 5000 sccm in step 400.

As described above, the present invention deposits a carbon-doped silicon oxide film that has good gap fill capabilities and a low dielectric constant. The film is also highly conformal. Films deposited according to the present invention are porous when compared to thermal silicon oxide. For example, thermal silicon oxide films generally have a density of between 2.1–2.2 g/cm$^3$. Films deposited according to the present invention, however, generally have a density of less than or equal to about 1.2 g/cm$^3$.

The porosity of the film is provided by very small or micropores as opposed to larger pores found in some porous oxide films. Generally, these micropores are evenly distributed throughout the film and have diameters less than about 100 Å. The present inventors have demonstrated that films deposited according to the present invention exhibit uniform removal rates across the surface of an entire wafer when subject to a CMP step. This is especially important for damascene processes that are used for the fabrication of many integrated circuits today as the surface of the film can become highly planarized after the CMP step allowing for very fine patters to be focused on a subsequently deposited metal layer film during a photolithography step. In one series of tests, films deposited according to the present invention exhibited CMP removal rates of 3687 Å/min. and 3087 Å/min. at a nonuniformity rate of 4 and 5 percent, respectively, as measured at 49 points across the surface of the wafer as would be understood by a person of ordinary skill in the art. These test results compared favorably to removal of a thermal oxide film at a rate of 1100 Å/min at a nonuniformity rate of 3 percent.

The gas flow rates recited and described above are optimized for deposition processes run in a Gigafill or DxZ chamber manufactured by Applied Materials and outfitted for 200 mm wafers. A person of ordinary skill in the art will recognize that the rates at which various precursor gases in the process gas are introduced are in part chamber specific and will vary if chambers of other design and/or volume are employed.

In other embodiments of the present invention, one or more dopants may optionally be included with the organosilane and ozone during deposition of the low-k layer for both PMD and IMD applications. For example phosphorous (P) may be added using, e.g., phosphine ($PH_3$) during the deposition described above to getter alkali metals, e.g., sodium (Na), thereby reducing metal contamination of the deposited film. Boron may be added, e.g. using diborane ($B_2H_6$). Boron tends to make the deposited film flow easily but also diffuses easily. Diffusion of Boron from the Si—O—C layer into an underlying silicon substrate might be useful for doping the silicon for making a device, such as a gate structure. Alternatively, both boron (B) and phosphorous may be added during deposition to produce a film that has a reduced viscosity and can be reflowed to achieve high aspect ratio gap-fill for PMD applications.

The inventors of the present invention have also discovered that the deposition rate and gap fill properties of Si—O—C films are optimized under different conditions. For example, the deposition rate of Si—O—C films is optimized when deposited with organosilanes at low pressure, i.e., about 150 torr or less and high temperature, i.e., greater than about 150° C. Gap fill properties of Si—O—C films, e.g., step coverage, are optimized when the film is deposited at relatively high pressure, i.e., greater than about 200 torr, and low temperature, i.e., about 125° C. or less. The conditions that optimize gap fill generally produce low deposition rates. The conditions that optimize deposition rate generally provide poor gap-fill. Since the conditions that optimize deposition rate and gap fill are contradictory to each other, it is problematic to optimize both in a single step deposition process.

To overcome this, an alternative embodiment of the deposition method described above optimizes both gap fill and deposition rate by dividing the deposition into two steps. The first step is optimized for gap fill while the second step is optimized for deposition rate. The first and second steps are performed with the gas mixtures and flow rates essentially as set forth above with respect to FIG. 9. In the first step, the throttle valve position is set to establish a pressure of between 200 and 700 torr, preferably about 200 torr while the pedestal is maintained at a temperature of about 125° C. In the second step helium is provided at 8000 sccm and 15% by weight of $O_3$ in $O_2$ is provided at 5000 sccm. The pedestal temperature is raised to between about 150 and 170° C. while the pressure is maintained at between 50 and 150 torr, preferably about 100 torr.

In another version of this embodiment, the second step can be a PECVD process. For example, a Si—O—C type low-k film can be deposited by energizing a process gas mixture of an organosilane with nitrous oxide ($N_2O$) or $O_2$ to form a deposition plasma. Suitable organosilanes include methylsilane, dimethylsilane (DMS), trimethylsilane (TMS), tetramethylsilane (T4MS) and phenylmethylsilane among others. The PECVD Si—O—C layer is under a compressive stress. The thermal deposited Si—O—C layer is under tensile stress. When the two layers are deposited on top of one another to form a combined film the compressive and tensile stresses tend to compensate for each other producing a low stress film. Such a low stress film would be resistant to cracking.

III. Process Integration of Deposition of a Low Dielectric Constant Layer

Figure 10:
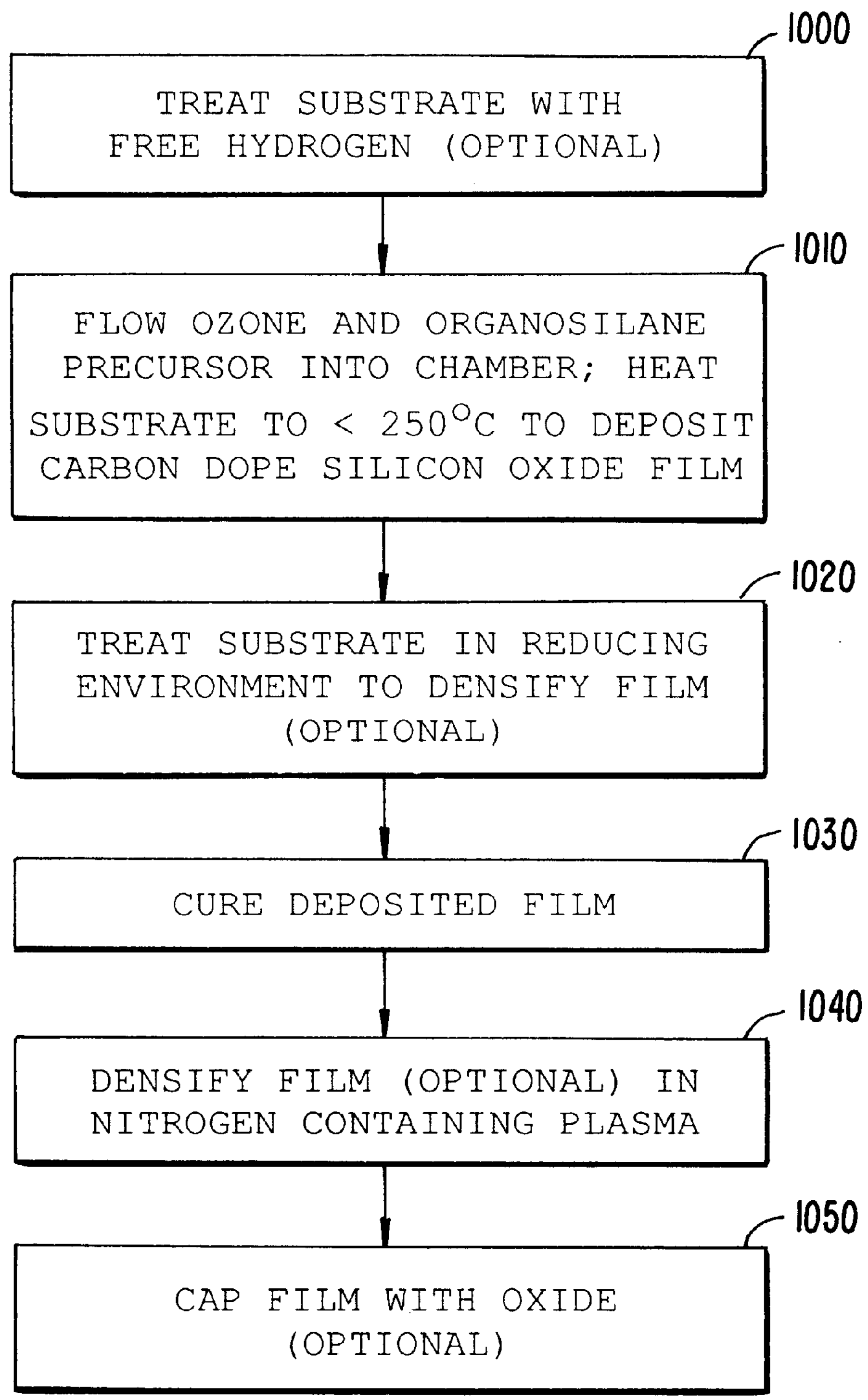
FIG. 10 is a flowchart illustrating the integration of the formation of a carbon-doped silicon oxide layer according to an embodiment of the method of the present invention.

While the above described ozone/organosilane carbon-doped silicon oxide film is useful for a variety of applications, the present inventors have developed a number of pre-deposition and post-deposition steps that facilitate the integration of a low K ozone/organosilane carbon-doped silicon oxide film according to the present invention into established integrated circuit manufacturing processes. One example of such a multistep process is depicted in FIG. 10. As shown in FIG. 10, the process starts with a pre-deposition treatment 1000 to enhance the adhesion of the film to underlying aluminum. The pre-deposition treatment 1000 uses free atomic hydrogen to reduce an aluminum oxide that builds up on the aluminum. In a specific embodiment, free atomic hydrogen is dissociated from a hydrogen-containing gas in a remote source. In another specific embodiment, the remote source energizes the hydrogen containing gas with electromagnetic radiation. In a preferred embodiment the electromagnetic radiation is in the form of microwaves. Further details of predisposition step 1000 are described below in conjunction with FIGS. 11*a* and 11*b*.

After pretreatment step 1000, layer of carbon-doped silicon oxide is deposited in step 1010 using an organosilane and ozone. This step has elements in common with the method set forth above with respect to FIG. 3 and FIG. 9.

An optional post deposition treatment 1020 further enhances adhesion by reducing shrinkage of the deposited film. This step is generally performed if the film is to be cured ex-situ. The post-deposition treatment 1020 takes place in a reducing environment. In a preferred embodiment, the deposited film is treated in a reducing environment of ammonia for approximately one minute at a temperature of approximately 400° C.

The method then proceeds to a cure 1030 (step 310 from FIG. 3), which may be performed either in-situ or ex-situ. After cure 1030, the film can be densified at 1040 to reduce outgassing of a subsequently deposited cap layer. In a preferred embodiment, the cured film is densified in a nitrogen-containing plasma. After densification 1040, the film can be capped at 1050 to prevent cracking of the film. In one embodiment, a cap layer of silicon oxide is deposited over the densified film by plasma enhanced chemical vapor deposition (PECVD). Further details of steps 1020, 1040 and 1050 are set forth in Section V, VI and VII below.

IV. Pre-Deposition Treatment

Figure 11A:
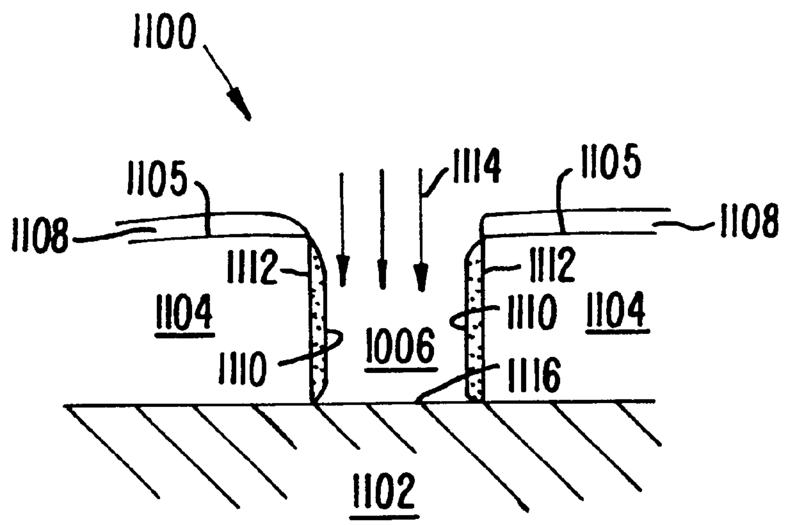
FIG. 11*a* is a cross sectional view of an integrated circuit structure undergoing sputtering.

Predeposition step 1000 discussed in FIG. 10 provides for strong adhesion of a layer of material deposited on an underlying substrate. For example, in some IMD applications a dielectric layer, such as a TMS-ozone layer, may adhere poorly to an underlying metal. Post deposition heating processes, such as cure processes, may cause the deposited film to shrink. As a result of the shrinkage, the deposited layer can become delaminated from the underlying metal. The adhesion problem is illustrated in FIG. 11*a*, which depicts a partially formed integrated circuit 1100. Integrated circuit 1100 generally includes an oxide layer 1102 and metal lines 1104 separated by a gap 1106. An upper surface 1105 of metal lines 1104 may be coated with a thin barrier such as titanium nitride (TiN). In the case of aluminum metal lines 1104, poor adhesion is believed to the result of a thin layer 1110 of aluminum oxide ($Al_xO_y$) on the surface of vertical walls 1112 of metal lines 1104. If oxide forming layer 1110 is one that forms readily at room temperature, layer 1110 tends to be weakly bonded to the underlying metal, i.e. metal lines 1104. Consequently a film deposited over oxide 1110 may become delaminated from metal lines 1104.

Previously known methods used to remove such an oxide layer include sputtering in a plasma. Ions from the plasma are accelerated towards the circuit 1100 in the direction shown by arrows 1114 by an electric field. Sputtering is effective at removing oxide from a bottom of gap 1106. Unfortunately because of the direction of acceleration of the ions, the plasma is much less effective at removing the oxide from the walls 1112.

Figure 11B:
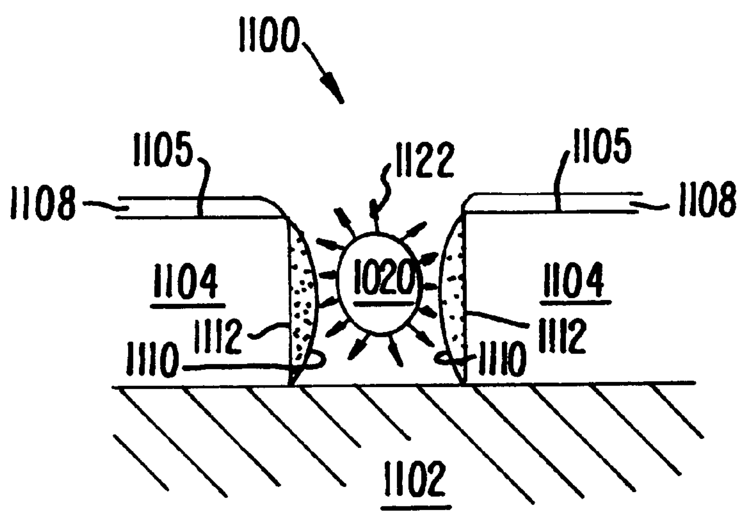
FIG. 11*b* is a cross sectional view of an integrated circuit structure undergoing treatment with free atomic hydrogen.

To overcome this, one embodiment of the present invention includes a pre-treatment step in which the oxide layer is reduced with free atomic hydrogen. The pre-treatment is illustrated in FIG. 11*b*. Free atomic hydrogen 1120 attacks the oxide in a purely thermal reaction in all directions as shown by arrows 1122. Since the thermal reaction is non-directional hydrogen 1122 can attack oxide 1110 on vertical walls 1112. Such a pretreatment can effectively remove aluminum oxide and may also be effective in reducing other metal oxides such as copper oxides ($Cu_xO_y$). Furthermore, such a pre-treatment is generally advantageous when a surface of a substrate contains a weakly bound oxide that would impair adhesion of a subsequently deposited layer of material.

Figure 2:
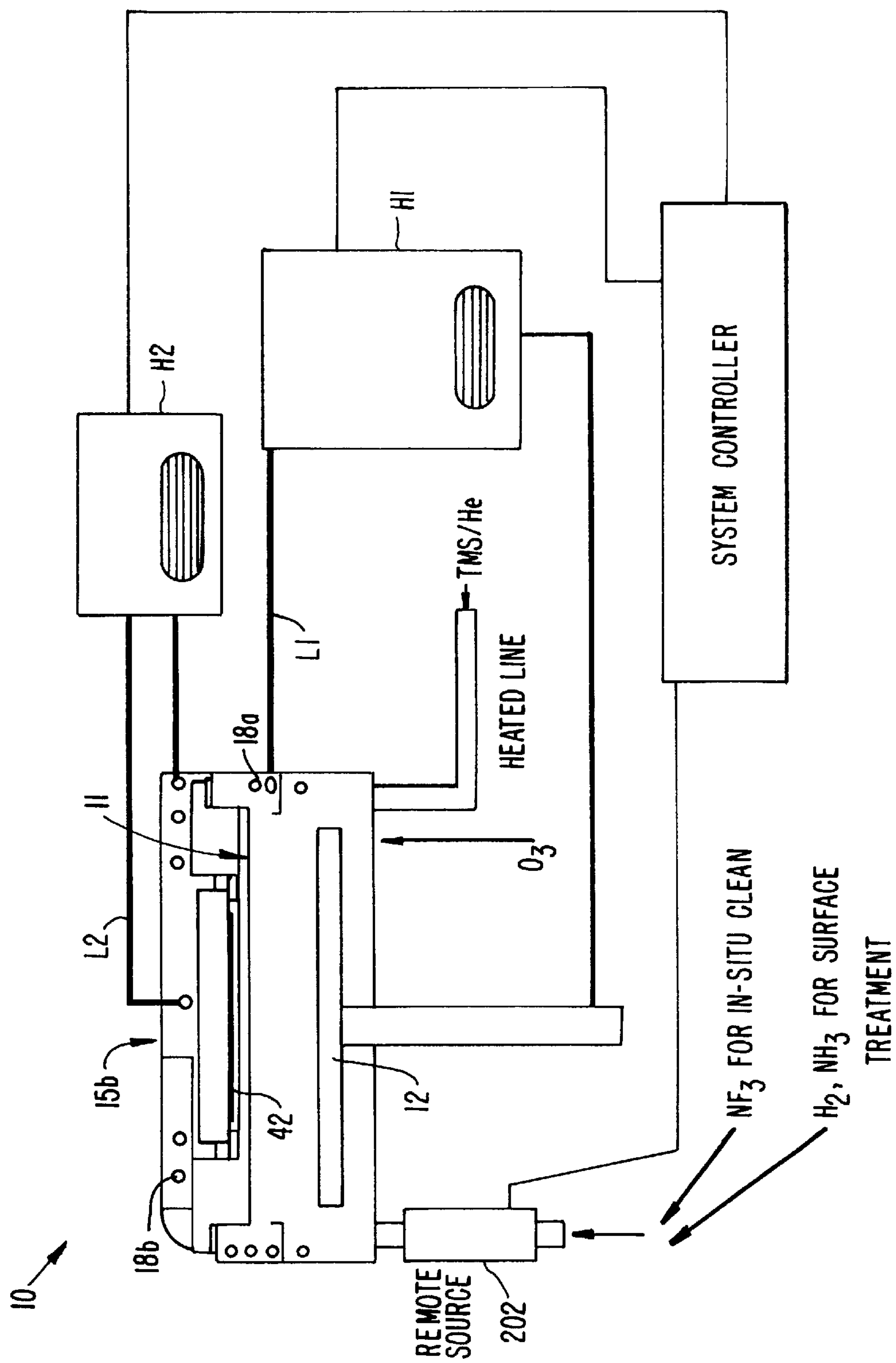
FIG. 2 is a simplified vertical cross sectional diagram of a CVD apparatus according to an alternative embodiment of the present invention.

As shown in FIG. 2, a remote source, fluidly coupled to the process chamber provides free atomic hydrogen for the pre-treatment. The remote source supplies energy that dissociates a hydrogen-containing gas such as ammonia ($NH_3$) or molecular hydrogen ($H_2$). Such a remote source can be a purely thermal source, in which hydrogen containing gas is dissociated by heating at a high temperature. More preferably, the remote source is a remote plasma source that dissociates hydrogen-containing gas in a plasma that is initiated and sustained with energy in the form of electromagnetic radiation. In this application, electromagnetic radiation is taken to mean any form of radiation resulting from oscillating electromagnetic fields. Such radiation includes but is not limited to all bands of the electromagnetic spectrum including long wave, radiofrequency, microwave, infrared, visible ultraviolet, x-ray and gamma ray. Still more preferably, the remote source dissociates hydrogen-containing gas with radiation having a frequency of between about 100 kilohertz (kHz) and 100 gigahertz (GHz). A strike gas such as argon (Ar) or nitrogen ($N_2$) may optionally be supplied to the remote plasma source to facilitate striking the plasma.

Figure 12A:
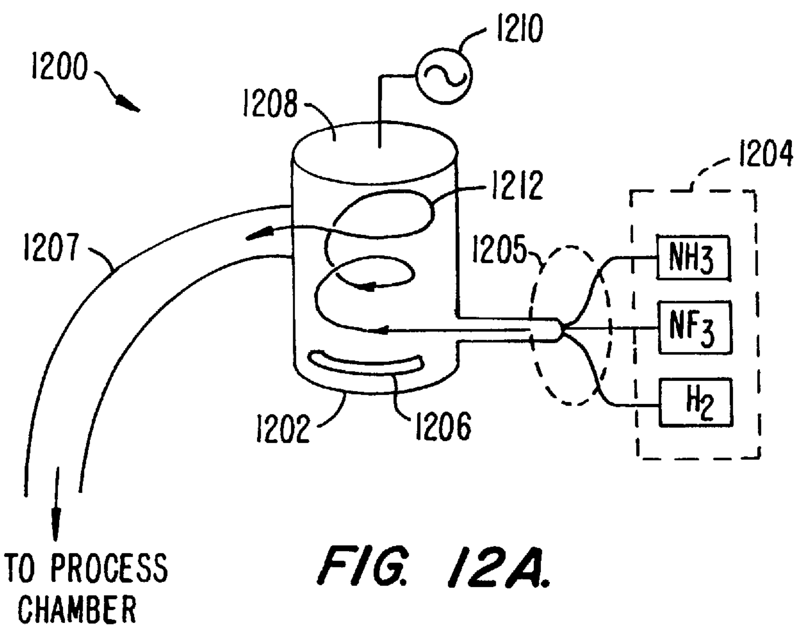
FIG. 12*a* depicts a remote RF plasma source according to an embodiment of the present invention.
Figure 12B:
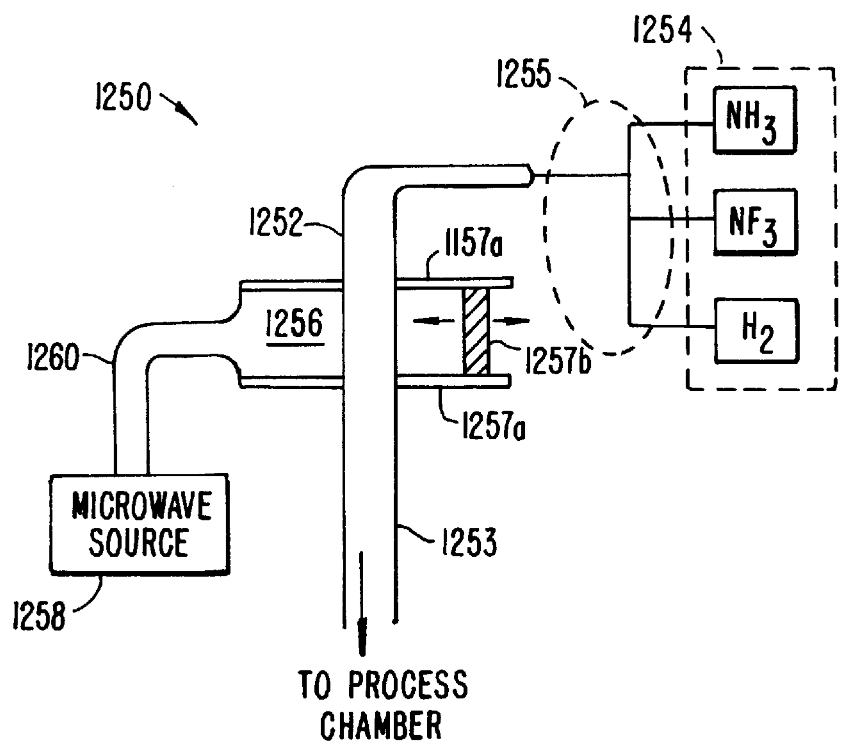
FIG. 12*b* depicts a remote microwave plasma source according to another embodiment of the present invention.

Two examples of such remote sources are shown in FIGS. 12*a* and 12*b*. The deposition chamber 15 generally includes a remote clean source 202 for cleaning the chamber with nitrogen trifluoride ($NF_3$), as shown in FIG. 2. Such a remote clean sources can be coupled to the system controller and configured to operate in response to instructions embodied in a computer program. This same remote clean source 202 can be configured to selectively receive a hydrogen-containing gas for the pre-treatment described above.

FIG. 12*a* depicts a remote RF plasma source 1200. Remote RF plasma source 1200 generally comprises a remote chamber 1202 coupled to gas sources 1204 via gas lines 1205. Remote chamber 1202 is fluidly coupled by a conduit 1207 to a process chamber such as chamber 15 depicted in FIGS. 1*a* and 1*b*. Gas sources 1204 provide hydrogen-containing gas to remote chamber 1202. Remote chamber 1202 includes gas deflectors 1206 and an RF electrode 1208. Deflectors 1206 direct the flow of gas in a spiral flow pattern 1212 within remote chamber 1202. RF electrode 1208 is coupled to an RF generator 1210. RF generator 1210 delivers energy in the form of RF radiation to the hydrogen containing gas via RF electrode 1208 Spiral pattern 1212 increases the residence time of hydrogen-containing gas in remote chamber 1202 thereby facilitating dissociation of free atomic hydrogen from the hydrogen containing gas. In one embodiment RF generator 1210 provides between 2000 and 5000 watts of RF power, preferably 3000 watts at frequency of between 1 MHz and 100 MHz, preferably about 13.56 MHz. $NH_3$ is provided to remote RF plasma source 1200 at about 950 sccm. Argon is also provided to remote RF plasma source 1200 at about 1500 sccm. An example of a suitable remote RF source 1200 is an ASTRON™ manufactured by Applied Science and Technology (ASTeX), of Woburn Mass. Such a source is capable of dissociating $NH_3$ with an efficiency of 95%.

FIG. 12*b* depicts a remote microwave plasma source 1250. Remote microwave plasma source 1250 generally comprises a microwave transparent discharge tube 1252 coupled to gas sources 1254 via gas lines 1255. Discharge tube 1252 is typically made from a dielectric material such as quartz. Discharge tube 1252 is fluidly coupled by a conduit 1253 to a process chamber such as chamber 15 depicted in FIGS. 1*a* and 1*b*. Gas sources 1254 provide hydrogen-containing gas to discharge tube 1256. Discharge tube 1252 is situated within a tunable microwave cavity 1256. Microwave cavity 1256 is coupled to a microwave generator 1258 via a microwave transmission line or waveguide 1260. Microwave cavity 1256 generally includes fixed walls 1257*a* and a movable wall 1257*b*. Movable wall 1257*b* moves longitudinally with respect to fixed walls 1257*a* thereby tuning cavity 1256 to optimize transfer of microwave power to the hydrogen containing gas. In one embodiment the microwave generator provides between 1500 and 2500 watts, preferably about 2100 watts of microwave power at frequency of between 1 and 5 GHz, preferably about 2.2 GHz. An example of a suitable remote microwave source 1250 is a Remote Clean™ source manufactured by Applied Science and Technology (ASTeX), of Woburn, Mass. Such a source is capable of dissociating $NH_3$ with an efficiency of 99%.

In a preferred embodiment of the pre-treatment process, the remote microwave source operates at a frequency approximately 2.2 gigahertz and a power of 2100 Watts. $NH_3$ is provided to remote the microwave source at 950 sccm. The substrate is generally at a temperature of 100° C. to 400° C. and the chamber wall is typically at a temperature of 65° C. The pressure in the remote source is approximately 8 torr and the chamber pressure is approximately 5 torr.

While the present invention is initially developed pre-treatment step 1000 in the context of an organosilane/ozone carbon-doped silicon oxide film, pretreatment step 1000 is applicable to any type of film that would benefit from atomic hydrogen treatment of the underlying layer.

V. Post Deposition Treatment

After deposition, a silicon carbon or Si—O—C film is often quite porous. Consequently, the film tends to absorb moisture. The absorbed moisture generally degrades the properties of the film. In the case of a low-k film, moisture tends to increase the dielectric constant of the film and is detrimental to film adhesion. The porosity is normally reduced during the previously described thermal cure. However, if the cure is performed ex-situ, the film is exposed for a time to moisture from the ambient atmosphere (e.g., the clean room atmosphere). The film may also tend to shrink during subsequent polymerization and curing processes.

Additional modifications to the above described deposition process provide for a post deposition treatment to enhance adhesion of a low-k dielectric layer to a subsequently deposited layer and reduce shrinkage. The post-deposition treatment (step 1020 in FIG. 10) generally includes a densification step performed before removing the substrate from vacuum. The densification involves heating the substrate in a reducing ambient atmosphere to reduce shrinkage of the low-k dielectric layer. Suitable reducing environments include $NH_3$ and $H_2$. The densification can be performed in the same chamber as the deposition, or a different chamber. If done in a different chamber, however, the wafer is preferably transferred to that chamber under vacuum controlled conditions.

In one embodiment of the post-deposition treatment the substrate is heated in an $NH_3$ ambient to between approximately 300 and 500° C., preferably about 400° C. for between 1 and 5 minutes, preferably about 1.5 minutes, at a pressure below atmospheric pressure. If the pressure in the chamber is above atmospheric pressure there is a possibility the greater pressure might cause the chamber lid to open. Typically, the pressure is between about 200 and 700 torr, preferably about 600 torr.

The densification described above is not normally employed in embodiments where the substrate is cured without breaking vacuum after depositing the low-k film. While the present inventors have found post deposition step 1020 to be particularly useful to stabilize low k ozone/organosilance carbon-doped silicon oxide films deposited according to the present invention and that are subsequently cured in an ex-situ process, step 1020 is a useful treatment for any film that is unstable in air. Such a densification is particularly useful for protecting low temperature deposited films that undergo an ex-situ cure. Such films include TMS-ozone films, spin on glass (SOG) and Black Diamond™. In the case of Black Diamond™, the densification is performed in an oxygen ($O_2$) ambient to remove hydrogen from the film.

VI. Post-Cure Plasma Densification Treatment

Si—O—C low-k films that have been deposited in accordance with the pre-deposition, deposition, post deposition, and curing processes described above are often subject to oxidizing environments in the course of subsequent processing. Such oxidizing processes include, but are not limited to, etching, photoresist strip and oxide capping processes. The low-k film is typically a silicon-oxy-carbon structure. In an oxidizing environment the low-k film can react with oxygen and hydrogen to form carbon dioxide ($CO_2$) and water vapor ($H_2O$). The reaction removes carbon from the film leading to shrinkage and increase in k-value.

Figure 13A:
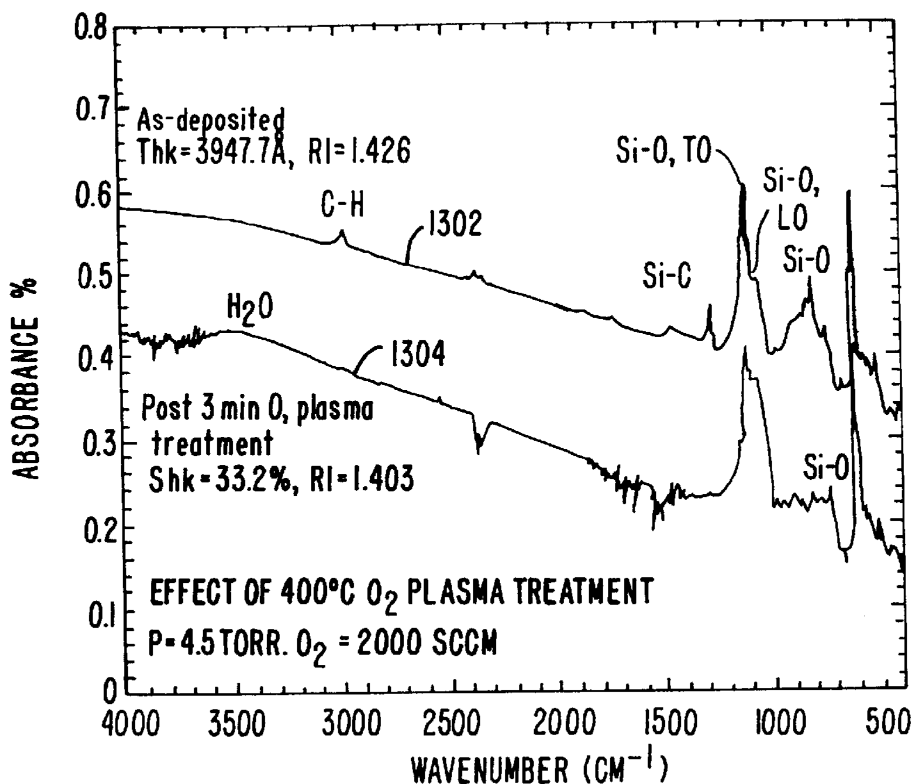
FIGS. 13*a*–13*e* depict FTIR spectra for carbon-doped silicon oxide films.
Figure 13B:
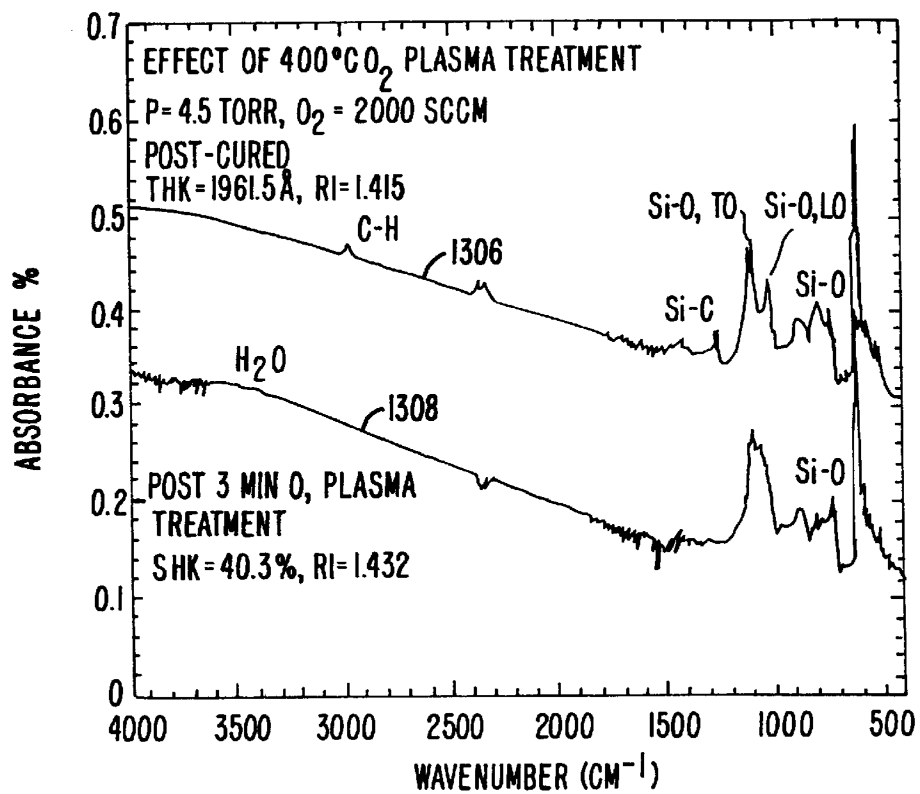

The situation is illustrated in the Fourier transform infrared (FTIR) spectra depicted in FIGS. 13*a*–13*d*. FIG. 13*a* depicts a first FTIR spectra 1302 for an as-deposited Si—O—C low-k film. Note the presence of C—H and Si—C bonds in the spectra indicating the desired Si—O—C structure. To simulate the effect of an oxidizing environment during processing, the as deposited film was subjected to an oxygen plasma for 3 minutes at 400° C. The oxygen plasma produces active oxygen species that attack the film. A second FTIR spectra 1304 taken after oxygen plasma treatment shows little or no C—H and Si—C bonds indicating the removal of carbon from the film. The FTIR spectra in FIG. 13*b*. show that oxygen plasma also removes carbon from a post-cured Si—O—C film. Spectra 1306, for example, was taken on a post cured TMS-ozone deposited film. Spectra 1308 was taken on the same film after treatment in oxygen plasma for 3 minutes at 400° C.

Figure 13C:
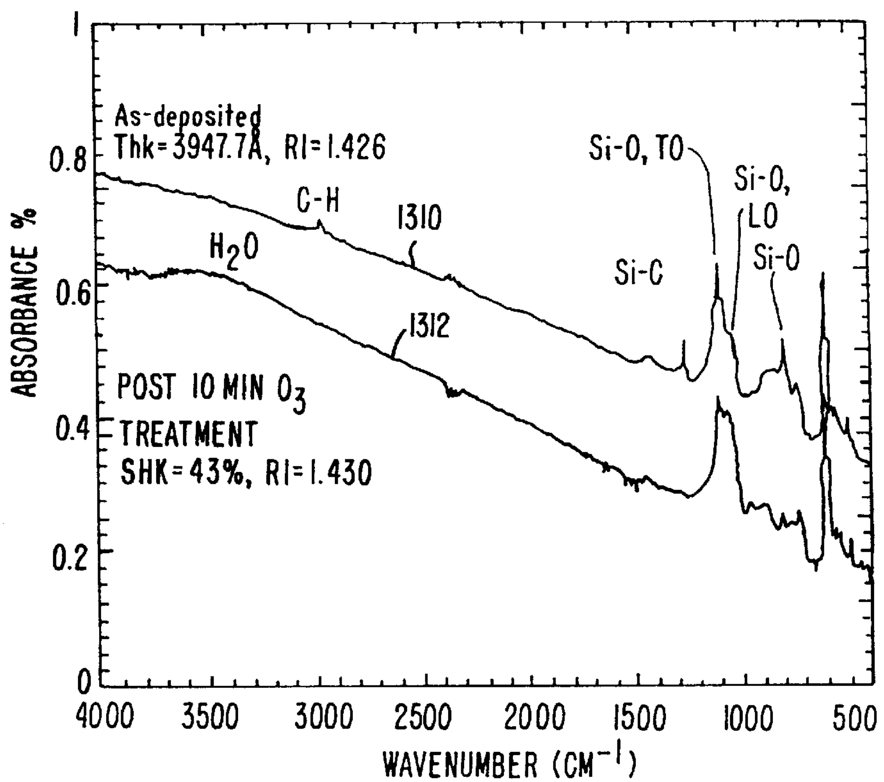
Figure 13D:
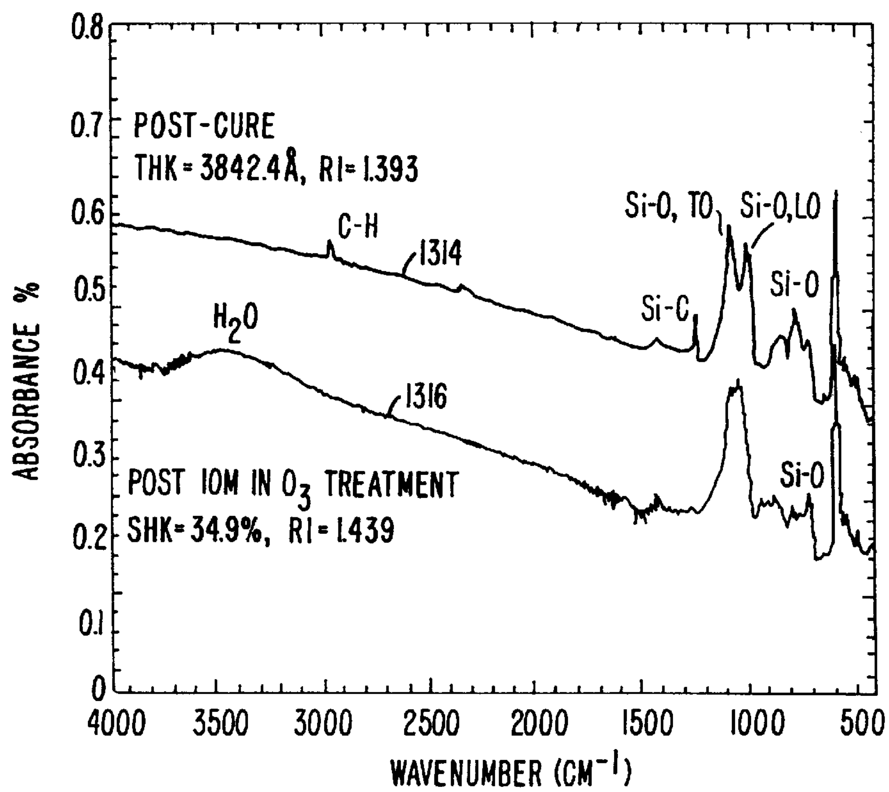

FIG. 13*c* depicts FTIR spectra from a similar experiment in which the as-deposited film was subjected to baking in an $O_3$ environment at 400° C. As in FIG. 13*a*, a post deposition FTIR spectrum 1310 shows C—H and Si—C bonds while a post bake FTIR spectra 1312 does not. The $O_3$ bake removes carbon from the film, which is believed to cause a collapse of the film structure resulting in a shrinkage in film thickness. The post-$O_3$-bake film also exhibited increased refractive index and moisture absorption. Furthermore, a post-cured film exhibited the same behavior as shown in post-cure spectra 1314 and post-bake spectra 1316 of FIG. 13*d*.

In addition to degradation of the cured film's properties, the film tends to outgas during subsequent heating (e.g., during annealing). The outgassing can cause bubbles that lead to delamination of a subsequently deposited layer.

To overcome these problems, another embodiment of the method of the present invention includes a densification treatment after the film is cured. The densification process is an optional process that depends, to a certain extent, on the type of low-k film. For example, a densification step is not normally implemented for a barrier low-k (BLOK™) film since this type of film has a silicon carbide (Si—C) structure that is not normally subject to oxidation. The plasma densification process is particularly useful for Si—O—C films deposited using an organosilane. Typically the densification plasma is an RF plasma containing helium (He), nitrogen ($N_2$), or Argon (Ar). Alternatively an RF or remote microwave plasma containing $NH_3$ and $O_2$ may be used. Preferably, the plasma is formed from a gaseous mixture of He and $N_2$. Ar plasma is not normally if sputtering would be a problem. However, Ar plasma may be used if, for example, sputtering is a desired effect.

In one embodiment, a substrate containing a TMS-ozone deposited low-k film is cured in-situ at approximately 400° C. for between approximately 3 and 30 minutes, preferably about 10 minutes. The cured film is then subjected to $N_2$ plasma for approximately two minutes while the substrate is heated to between approximately 350 and 450° C., preferably about 400° C. The chamber pressure is typically maintained at between about 1.2 and 5.0 torr, preferably about 1.5 torr. The plasma is sustained by radiofrequency (RF) energy delivered at a power of between 500 and 900 watts, preferably about 700 Watts and a frequency of between 100 KHz and 100 MHz, preferably about 450 KHz. One example of a suitable chamber for the densification process is a DxZ PECVD chamber manufactured by Applied Materials of Santa Clara, Calif. Such a chamber is described in U.S. Pat. No. 5,558,717.

Figure 13E:
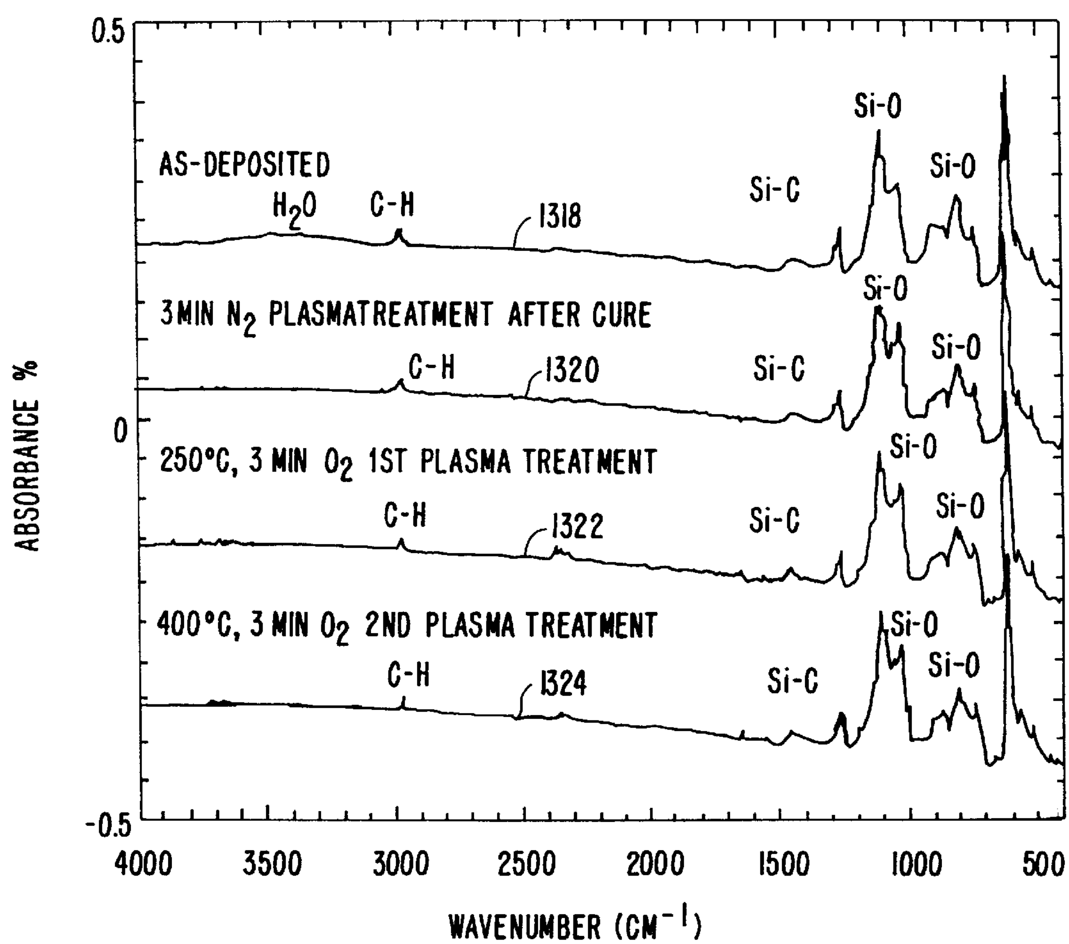

FIG. 13*e* depicts FTIR spectra taken for TMS/ozone deposited Si—O—C film that was treated with the densification described above following a post-deposition cure. Spectra 1318, taken for the as-deposited film, exhibits the C—H and Si—C bonds characteristic of the desired film structure. The as-deposited film was cured and then subjected to densification in an $N_2$ plasma. In this case, the substrate temperature was 250° C., and chamber pressure was 4.5 torr during plasma densification. Nitrogen was provided at a flow rate of 2000 sccm. RF power of 700 watts was provided at a frequency of 13.56 MHz. Spectra 1320 was taken on the same film after the $N_2$ plasma treatment. Note that the C—H and Si—C bonds are little changed compared to as-deposited spectra 1318. The densified film was then subjected to a first oxygen plasma for 3 minutes at a substrate temperature of 250° C. Spectra 1322, taken after the first oxygen plasma treatment, shows little change in the C—H and Si—$CH_3$ bonds. The same film was then subjected to a second oxygen plasma for 3 minutes at a substrate temperature of 400° C. Spectra 1224, taken after the second oxygen plasma treatment, again shows little change in the C—H and Si—$CH_3$ bonds. Table I shows the effect of the $N_2$ and oxygen plasma treatments on film properties.

TABLE I

| Film | Thickness (Å) | Shrinkage after initial cure (%) | Refractive Index |
|---|---|---|---|
| As-deposited | 3716.2 | | 1.428 |
| Post-cure | 3440.3 | | 1.397 |
| $N_2$ plasma treated | 3394.3 | 1.34 | 1.397 |
| 250° C. $O_2$ plasma | 3287.4 | 4.44 | 1.396 |
| 400° C. $O_2$ plasma | 3249.3 | 5.55 | 1.396 |

As can be seen in FIG. 12*e*, the plasma densification process stabilizes the film and prevents removal of carbon in an oxidizing environment such as etch and photoresist strip. Table I demonstrates that the $N_2$ treatment has a negligible effect on the refractive index (and therefore k-value) of the film. Table I further demonstrates that the $N_2$ densification process produces relatively little shrinkage of the post cured film.

Furthermore, the present inventors have discovered that if an overlying cap layer is deposited over an ozone/organosilane film according to the present invention, densification treatment 1040 prevents delamination of an overlying cap layer due to bubble formation. Bubbles may form with an undensified Si—O—C layer due to outgassing from the Si—O—C layer during high temperature processes such as annealing. In an experiment, a low-k film was deposited on a substrate using TMS-ozone as described above. After deposition, the substrate was cured for 5 minutes at 400° C. After curing, the substrate was subject to $N_2$ plasma for 2 minutes and then capped with PE TEOS. The substrate exhibited no bubbling of the cap layer even after annealing at 450° C.

VII. Capping TMS-Ozone Deposited Layers

In some instances, the present inventors have found that Si—O—C films that have been deposited in accordance with the pre-deposition, deposition, and post deposition and densification described above may still be susceptible to cracking after curing as described above. This occurs in spite of the fact that the observed stress, the-k-value, and the FTIR spectrum for the film do not change over time. The present inventors have observed that the susceptibility of the film to cracking depends upon the thickness of the deposited film and the length of time to which the film is exposed to the ambient (air). A post-cured film 6000 Å or less in thickness, that has not undergone plasma densification, is typically stable, i.e. it does not crack after an indefinite period of time after exposure to ambient. At 8000 Å an undensified film cracks after about one week exposure. At 1.2 microns, and undensified film typically cracks upon removal from the chamber, i.e., upon exposure. Generally, the thicker the film, the sooner the film cracks. Densification also affects the thickness at which the film cracks. For example, the present inventors have found that a post cured organosilane deposited Si—O—C film that has not been densified in a nitrogen plasma, as described above, cracks at thickness of 8000 Å or more within about a week. A comparable film, that has undergone plasma densification, is stable up to a thickness of about 1.2 microns. At about 1.6 microns thick, a plasma densified film cracks after about two days. At 2 microns thickness, or greater, a densified film typically cracks upon removal from the chamber.

To overcome this, another embodiment of the present invention includes capping the TMS-ozone deposited low-k film with a layer of oxide or nitride. It is believed that the if the cap layer is harder than TMS-ozone low-k layer the cap layer physically holds the low-k film together. The cap layer provides a barrier against moisture penetration of the low-k film. The cap layer, typically a silicon oxide or silicon nitride, may be deposited by any conventional means. Preferably the cap layer is a silicon oxide deposited to a thickness of between 1000 Å and 3000 Å by plasma enhanced chemical vapor deposition (PECVD) using a precursor such as TEOS. Such a cap layer is referred to herein as a PE TEOS layer. The inventors have found that a TMS-ozone film that has been plasma densified and capped with a 1000 Å PE TEOS film is stable up to a thickness of 1.6 microns. At about 2 microns thick, a densified and cupped film cracks after 3–4 days. Silicon nitride generally provides a stronger cap layer and a better moisture barrier. Consequently, silicon nitride cap layers can be thinner, perhaps for example, or the order of a few hundred angstroms.

In some applications, a cap layer might be undesirable. For example in processes that require a low interlayer capacitance, such as damascene processes, a cap layer might not be used. The inventors have found however that capping solves the problem of film cracking.

VIII. Exemplary Enhanced Deposition of an Si—O—C Layer

FIGS. 14*a*–14*f* depict detailed flow diagrams of the steps of an exemplary embodiment of the method of the present invention depicted in FIG. 10. In this exemplary embodiment, the substrate is pre-treated using a remote microwave plasma containing $NH_3$ in step 1000. The Si—O—C layer is deposited with TMS-ozone using dual heat exchangers in step 1010. The as-deposited Si—O—C layer is densified in a reducing ambient of $NH_3$ in step 1020 and furnace cured ex-situ in step 1030. In an alternative embodiment, the Si—O—C film is cured in-situ and densification step 1020 is omitted. The cured Si—O—C layer is densified in a nitrogen containing plasma in step 1040 and capped with PE TEOS in step 1050.

Figure 14A:
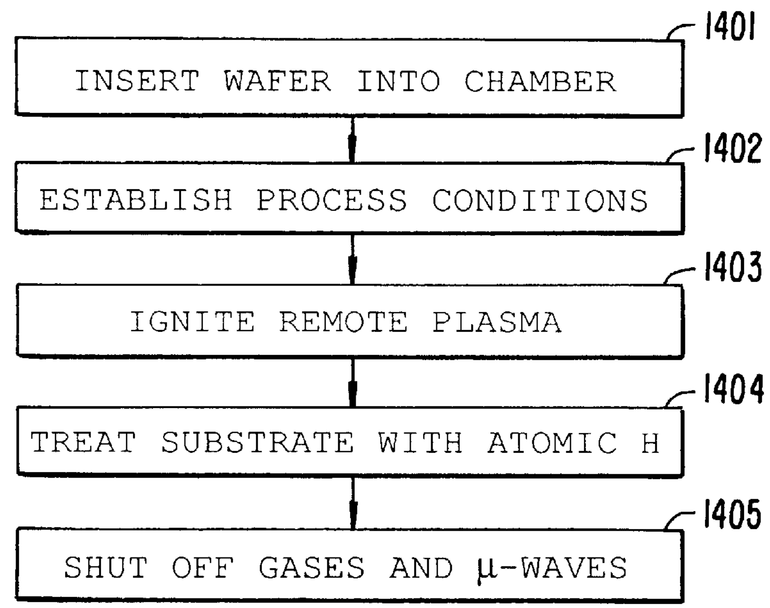
FIGS. 14*a*–14*f* depict flow diagrams illustrating the integration enhancements to formation of a carbon-doped silicon oxide layer according to another embodiment of the method of the present invention.

The flow diagram of FIG. 14*a* shows the details of an exemplary pretreatment step, shown in FIG. 10 as step 1000. In the pre-treatment process of FIG. 14*a*. A wafer is inserted into the chamber at step 1401. Gas flows and temperatures are established in step 1402. $NH_3$ is supplied to the remote microwave source at about 950 sccm. The pressure is stabilized at about 8 torr in the microwave source and 8 torr in the chamber. The pedestal is maintained at a temperature of approximately 125° C. and the chamber wall is typically at a temperature of approximately 65° C. during pretreatment. In step 1403, the remote microwave source applies microwaves to the gases to ignite the remote plasma. The microwave frequency is approximately 2.2 gigahertz and microwave power is about 2100 Watts. In step 1404, atomic hydrogen produced in the plasma treats the substrate for between about 1 to 5 minutes, preferably about 1.5 minutes. Finally, the gases and microwaves are shut off (step 1405).

Figure 14B:
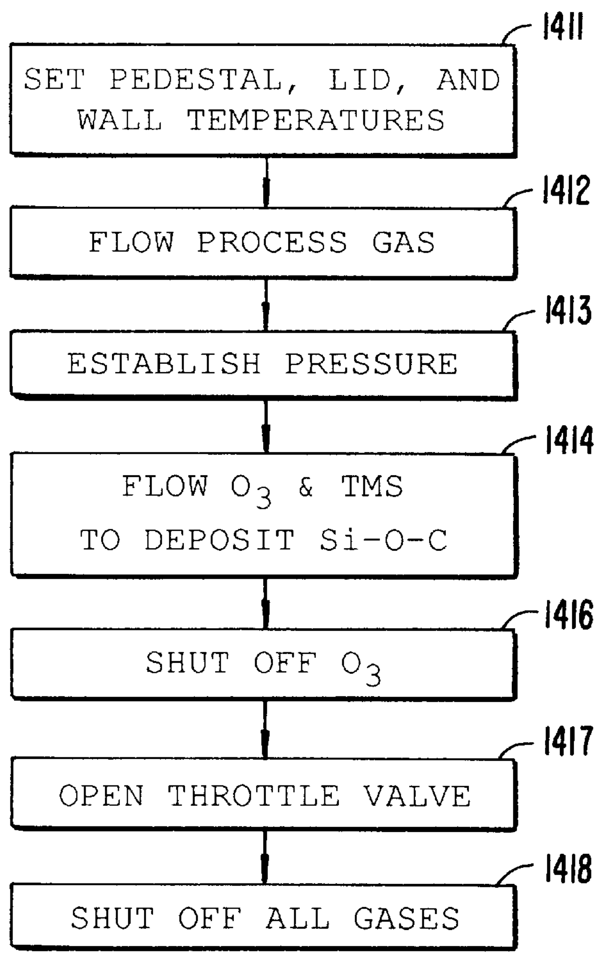

FIG. 14*b* is a flowchart of one embodiment of a thermal deposition process, shown in FIG. 10 as step 1010, that employs a process gas of TMS, ozone and helium. This particular embodiment utilizes dual heat exchangers to separately control chamber wall temperature and chamber lid temperature. The process set forth in FIG. 14*b* is for exemplary purposes only and should not be considered limiting to the scope of the present claims. The pedestal and heat exchanger temperatures are set and stabilized prior to film deposition in step 1411. All three temperatures are maintained approximately constant throughout deposition. In the above example, the walls are maintained at about 60° C., the lid of the deposition chamber is maintained at a temperature of about 25° C. and the pedestal is maintained at a temperature of about 400° C. The deposition process is initiated, after a wafer has been loaded into the deposition chamber, by flowing helium (8000 sccm) and oxygen (5000 sccm) gases while keeping the throttle valve fully open (step 1412) for several seconds to stabilize the gas flows. Ozone is not introduced at this stage because the high reactivity of ozone.

Once the gas flow has stabilized, the throttle valve is partially closed and the pressure within the chamber is brought to the desired deposition pressure level in the presence of the helium and oxygen flows (step 1413). Once the desired pressure level is reached and maintained for a couple of seconds, an ozone flow (5000 sccm) is substituted for the oxygen flow and a flow of TMS is initiated (500 sccm) to deposit a carbon-doped silicon oxide film (step 1414). Deposition step 1414 continues until the carbon-doped silicon oxide layer reaches a desired thickness and then the ozone flow is shut off (step 1415). The ozone flow is switched off prior to the TMS flow in order to allow the TMS to react with residual ozone in the gas phase. The TMS flow is then shut off several seconds after the ozone flow (step 1416) and the deposition pressure is released by opening the throttle valve while maintaining the helium flow (step 1417). Finally, all the gases are shut off (step 1418).

Figure 14C:
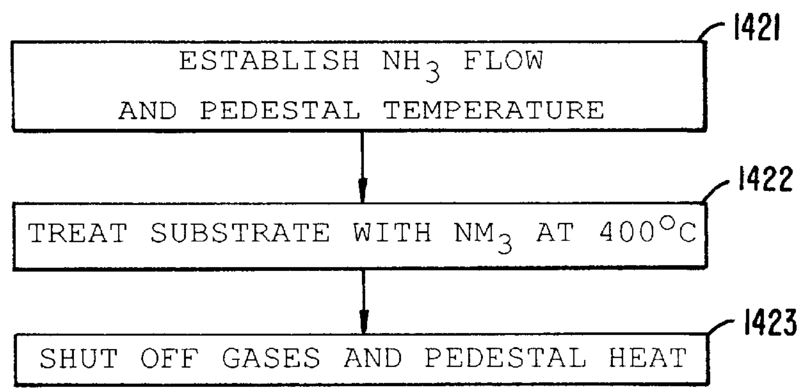

The flow diagram of FIG. 14*c* shows the details of an exemplary post-deposition densification step, shown in FIG. 10 as step 1020. In the exemplary embodiment, this step is performed because the substrate is cured ex-situ in the following step. The exemplary post-deposition densification begins at step 1421, by establishing gas flows and temperatures. $NH_3$ is supplied at a pressure of about 600 torr and the substrate is heated to about 400° C. The substrate is treated for about 90 seconds minutes in step 1422. Gases pedestal heating are shut off and the pedestal allowed to cool in step 1423.

Figure 14D:
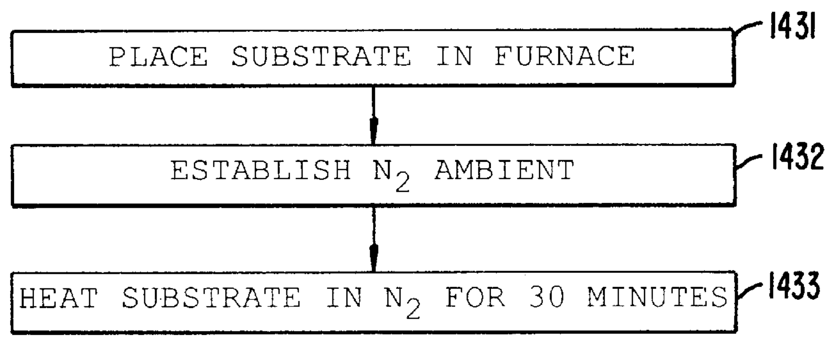

The flow diagram of FIG. 14*d* shows the details of an exemplary furnace cure, shown in FIG. 10 as step 1030. In the exemplary embodiment, the substrate is removed from a vacuum environment and placed in a furnace in step 1431. Of course, multiple wafers may be placed in the furnace for simultaneous curing. Substrate process throughput is generally optimized when as many substrates as possible are furnace cured at the same time. An ambient atmosphere of nitrogen ($N_2$) is provided to the furnace at step 1432. The furnace then heats the substrate to a temperature of about 400° C. for a period of about 30 minutes in step 1433.

Figure 14E:
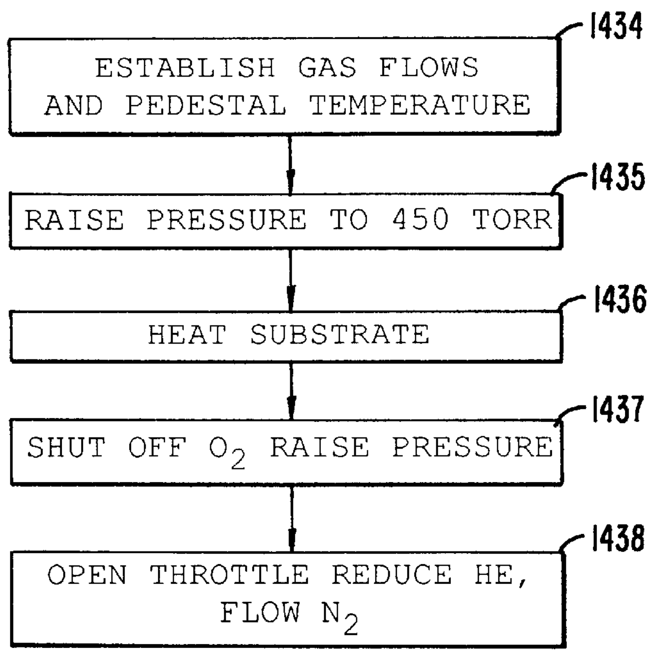

The flow diagram of FIG. 14*e* shows the details of an exemplary in-situ cure, shown in FIG. 10 as step 1030. Such a cure can be performed in a chamber such as that depicted in FIGS. 1A–1F. The pedestal temperature and gas flows of helium He and $O_2$ are established with the throttle valve open in step 1434. He is supplied at about 6000 sccm and $O_2$ is supplied at about 3000 sccm. The pedestal temperature is set to about 400° C. The presence of $O_2$ enhances shrinkage during the cure. In step 1435, the throttle valve is partially closed to raise the pressure in the chamber to about 450 torr. The substrate is then heated with the pedestal at a temperature of 400° C. and the chamber pressure at 450 torr for about 10 minutes in step 1436. The flow of oxygen is shut off at step 1437 and the chamber is purged. The pressure is raised to about 800 torr by further closing the throttle valve. In step 1438, the throttle valve is fully opened. The helium flow is reduced to about 2000 sccm and a flow of about 500 sccm of $N_2$ is introduced to the chamber.

Figure 14F:
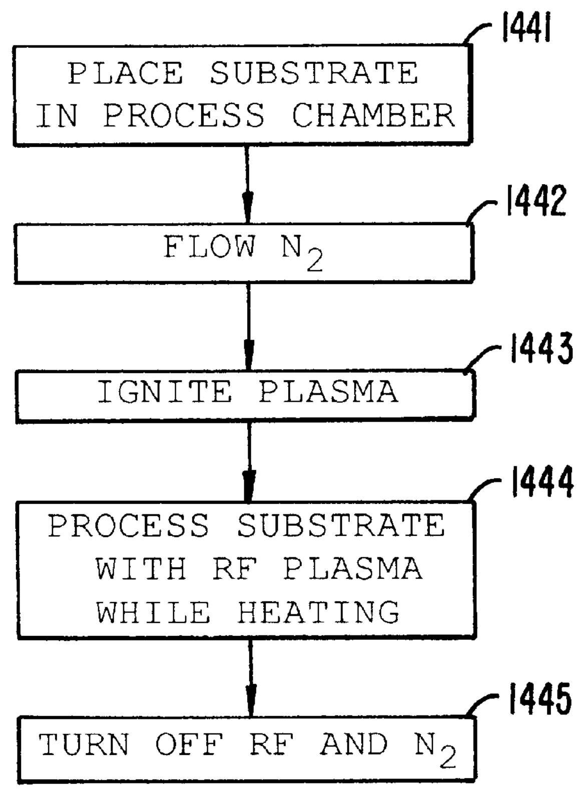

The flow diagram of FIG. 14*f* shows the details of an exemplary post-cure plasma densification step, shown in FIG. 10 as step 1040. The plasma densification may be performed in a processing chamber of the type depicted in FIGS. 1A–1F. If the cure step preceding the plasma densification was an in-situ cure, plasma densification may take place in the same chamber as the cure. If the cure step was a furnace cure, the post cured substrate is removed from the furnace and placed in a processing chamber in step 1441. A process gas of $N_2$ is supplied to the chamber in step 1442. The process gas is then ignited to form a plasma in step 1443. The substrate is then subjected to $N_2$ plasma for approximately two minutes while the substrate is heated to about 400° C. in step 1444. The chamber pressure is maintained at about 1.5 torr. The plasma is sustained by radio frequency (RF) energy delivered at a power of about 700 Watts and a frequency of about 450 kHz. The RF power is turned off and the gas flows are stopped in step 1445.

Figure 14G:
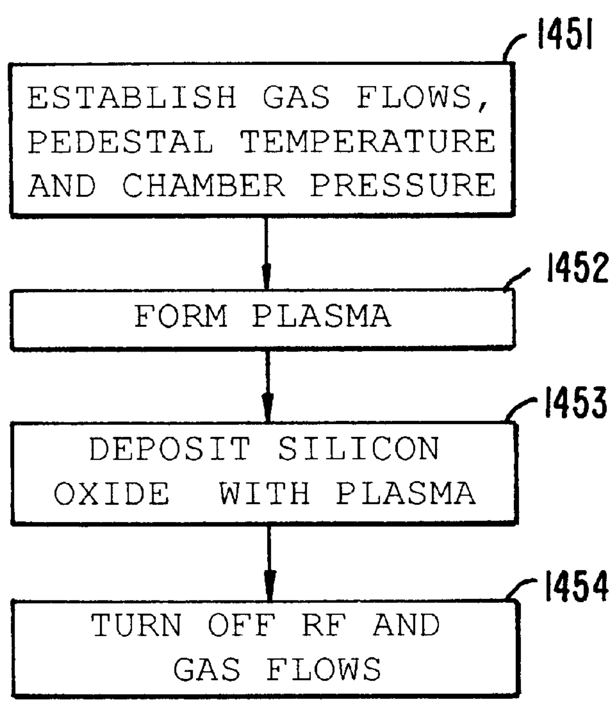

The flow diagram of FIG. 14*g* shows the details of an exemplary capping step, shown in FIG. 10 as step 1050. In the exemplary embodiment, the cap layer is deposited on the plasma densified Si—O—C layer in the same chamber as that used in the plasma densification step. Alternatively, the substrate containing the Si—O—C film may be transferred to a different chamber for capping. In step 1451, process gas flows and other process conditions are established. Helium is provided at about 1000 sccm. TEOS is provided at about 1050 milligrams/minute (mgm). Oxygen ($O_2$) is provided at about 1000 sccm. The chamber pressure is generally about 8.2 torr and the pedestal temperature about 400° C. In step 1452 the process gases are energized to form a plasma. 1000 Watts of RF power are supplied at a frequency of about 13.56 MHz. In step 1453 a silicon oxide cap layer is deposited using the plasma. Deposition proceeds until the cap layer has a thickness of about 2000 Å. In step 1454, RF power is turned off and the flow of process gases is stopped. The substrate may then be removed from the chamber for further processing, such as photoresist deposition, metal deposition, etc.

The methods described above can be readily incorporated into existing process recipes. For example, FIGS. 15*a*–15*h* depict one example of an IMD gap fill process incorporating the above method. In FIG. 15*a* a first metal layer 1502 of Al is deposited on an Si substrate 1500. An anti-reflective coating of TiN 1504 is deposited on Al layer 1502. In FIG. 15*b* a first photoresist layer 1506 is deposited on the TiN 1504. The walls of gaps 1508 are treated with free atomic hydrogen as described above to reduce aluminum oxide. In FIG. 15*c* TiN and Al layers are etched to form gaps 1508 using the patterned photoresist 1506. In FIG. 15*d* A low-k TMS layer 1510 is deposited, cured and densified as described above to fill gaps 1508. TMS layer 1510 is capped with PE TEOS 1512. PE TEOS layer 1512 is planarized (e.g., using CMP) and covered with a second patterned photoresist 1514 in FIG. 15*e*. PE TEOS and TMS layers are then etched through second patterned photoresist layer 1514 down to TiN layer 1504 to form vias 1516 as shown in FIG. 15*f*. After etching, photoresist 1514 is stripped, e.g., by ashing in an oxidizing environment. Densification treatment 1040 protects PE TEOS and TMS layers during etch and photoresist strip. Vias 1516 are filled with a metal such as tungsten to form interconnects 1518 as shown in FIG. 15*g*. After planarization, a second metal layer 1520 and barrier layer 1522 can be deposited over interconnects 1518 as shown in FIG. 15*h*. The process of FIGS. 15*b*–15*h* can then be repeated multiple times until the desired integrated circuit structure is complete. Such a process integration scheme is simple and involves relatively little complexity with CMP, etch, and photoresist strip. Such a process does produce relatively high k values between the metal layers due to PE TEOS layer 1512. Lower k values between the lines can be achieved, for example by eliminating the deposition of PE TEOS cap layer 1512.

A dual-damascene process integration scheme that utilizes the low-k TMS-ozone deposition method described herein is depicted in FIGS. 16*a*–16*h*. The dual damascene process begins with the deposition of an oxide layer 1602 over a silicon substrate 1600 as shown in FIG. 16*a*. A hardmask layer 1604, e.g., silicon nitride ($Si_3N_4$), is deposited over oxide layer 1602. A first low-k TMS layer 1606 is deposited, cured and densified as described above. First TMS layer 1606 is covered with a patterned photoresist layer 1608 during a first photolithography as shown in FIG. 16*b*. In FIG. 16*c*, a first etch forms a first set of gaps 1610 in first TMS layer 1606 down to hardmask layer 1604. After the first etch, photoresist 1608 is stripped, e.g., by ashing in an oxidizing environment. Densification treatment 1040 protects TMS layer 1606 during etch and photoresist strip. Gaps 1610 and first TMS layer 1606 are then covered with a layer of metal, such as aluminum or copper. In the case of copper, a seed layer 1612 (FIG. 16*c*) is deposited over gaps 1610 and first TMS layer 1606. A first bulk copper layer 1614 is deposited to fill the gaps 1610 as shown in FIG. 16*d*. Copper layer 1614 is planarized, e.g., by CMP. Copper layer 1614 forms, e.g., a first set of metal lines in an interconnect structure.

After planarization, of copper 1614, a second hardmask layer 1616, a second TMS 1618 layer, a third hardmask layer 1620 and third TMS layer 1622 are deposited as shown in FIG. 16*e*. A second lithography and etch forms vias 1624 through layers 1616, 1618, 1620 and 1622 down to copper layer 1614 as shown in FIG. 16*f*. In FIG. 16*g*, a third lithography and etch forms a second set of gaps 1626. Gaps 1626 define a second set of metal lines and vias 1624 define a set of interconnects between the second set of metal lines and the first set of metal lines defined by gaps 1610 and copper layer 1614. Vias 1624 and gaps 1626 are then filled with a second bulk copper layer 1628 as shown in FIG. 16*h*. The resulting structure is then annealed and planarized.

Damascene processes are used in devices that use copper interconnects because there is currently no acceptable way to etch copper. Structures formed by damascene processes do not require a gap-fill dielectric and generally provide lower RC delays than similar structures formed using aluminum metal lines. Furthermore, higher deposition rates may be used in damascene processes since gap-fill is not an issue.

Having fully described several embodiments of the present invention, many other equivalent or alternative methods of depositing the low dielectric constant oxide layer according to the present invention will be apparent to those skilled in the art. These alternatives and equivalents are intended to be included within the scope of the present invention.

What is claimed is:

1. A substrate processing system comprising:

a housing defining a process chamber;

a substrate bolder, adapted to hold a substrate during substrate processing;

a heater, operatively coupled to heat said substrate holder;

a gas delivery system configured to introduce gases into said process chamber;

a power supply, configured to deliver energy to said process chamber;

a controller for controlling said gas delivery system and said heater; and a memory coupled to said controller comprising a computer-readable medium having a computer-readable program embodied therein for directing operation of said controller, said computer-readable program including a first set of instructions to control said gas delivery system to flow a process gas comprising ozone and an organosilane having at least one silicon-carbon bond into the substrate processing chamber and control said heater to heat the substrate holder to a temperature of between 100–250° C.;

a second set of instructions to control said heater to cure the carbon-doped silicon oxide layer after it is formed over the substrate; and a third set of instructions to control said gas delivery system and said power supply to generate a plasma for densifying the carbon-doped silicon oxide layer after said curing.

2. The substrate processing system of claim 1 further comprising a fourth set of instructions to control said gas delivery system to flow a carrier gas comprising at least one of helium (He), nitrogen ($N_2$), and Argon (Ar) into the processing chamber, such that the plasma generated contains helium (He), nitrogen ($N_2$), or Argon (Ar).

3. The substrate processing system of claim 2 wherein the third set of instructions controls said gas delivery system and said power supply to generate an $N_2$ plasma.

4. The substrate processing system of claim 3 wherein the third set of instructions causes the substrate to be exposed to said $N_2$ plasma for between 1 and 10 minutes.

5. The substrate processing system of claim 4 further comprising a source of radio frequency (RF) energy in communication with the process chamber, wherein to third set of instructions causes said $N_2$ plasma to be sustained by radio frequency (RF) energy generated by the radio frequency energy source.

6. The substrate processing system of claim 5 wherein the third set of instructions causes said RF energy to be delivered to the process chamber at a power of between 500 and 900 watts.

7. The substrate processing system of claim 5 wherein the third set of instruction causes said RF energy to be delivered to the process chamber at a frequency of between 100 kilohertz and 100 megahertz.

8. The substrate processing system of claim 5 wherein the third set of instructions causes said $N_2$ plasma to have a pressure of between about 1.2 and 4 torr.

9. The substrate processing system of claim 1 wherein the first set of instructions causes an organosilane precursor selected from the group of methylsilane, dimethylsilane, trimethylsilane, tetramethysilane and phenylmethylsilane to be flowed into the process chamber.

10. The substrate processing system of claim 1 wherein to third set of instructions causes the substrate to be heated during the densification step.

11. The substrate processing system of claim 10 wherein the third set of instructions causes the substrate to be heated to a temperature of between approximately 350° C. and 450° C. during the densification step.

12. The substrate processing system of claim 1 wherein the third set of instructions causes plasma to be generated in the processing chamber.

13. The substrate processing system of claim 12 further comprising a plasma generating chamber remote from the process chamber and in fluid communication with the process chamber the third set of instructions causing said plasma is generated in the plasma generating chamber and flowed and flowed to the process chamber.

14. A computer readable storage medium having a computer-readable program embodied therein for directing operation of a substrate processing system including a process chamber; a substrate holder; a heater, operatively coupled to heat said substrate holder; a gas delivery system configured to introduce gases into said process chamber, a power supply, configured to deliver energy to said process chamber, said computer-readable program including instructions for operating said substrate processing system to form an insulation layer over a substrate disposed in the processing chamber in accordance with the following:

flowing a process gas comprising ozone and an organosilane into the substrate processing chamber;

heating the substrate to a temperature of less than about 250° C. to form a carbon-doped silicon oxide layer over the substrate;

curing the carbon-doped silicon oxide layer after it is formed over the substrate; and densifying the carbon-doped silicon oxide layer after said curing.

15. The computer-readable program of claim 14 wherein the instructions for densifying the carbon-doped silicon oxide layer comprise forming a plasma comprising at least one of helium (He), nitrogen ($N_2$), and Argon (Ar).

16. The computer readable program of claim 15 wherein the instructions for densifying the carbon-doped silicon oxide layer comprise forming an $N_2$ plasma.

17. The computer readable program of claim 16 wherein the instructions for densifying the carbon-doped silicon oxide layer comprise instructions to expose the substrate to said $N_2$ plasma for between 1 and 10 minutes.

18. The computer readable program of claim 17 wherein the instructions for densifying the carbon-doped silicon oxide layer comprise instructions to sustain said $N_2$ plasma by the application of radio frequency (RF) energy.

19. The computer readable program of claim 18 wherein the instructions for densifying the carbon-doped silicon oxide layer comprise instructions to deliver RF energy to the process chamber at a power of between 500 and 900 watts.

20. The computer readable program of claim 18 wherein the instructions for densifying the carbon-doped silicon oxide layer comprise instructions to deliver RF energy to the process chamber at a frequency of between 100 kilohertz and 100 megahertz.

21. The computer readable program of claim 18 wherein the instructions for densifying the carbon-doped silicon oxide layer comprise instructions to maintain said $N_2$ plasma at a pressure of between about 1.2 and 4 torr.

22. The computer readable program of claim 14 wherein the instructions for flowing the process gas comprise instructions to flow the organosilane precursor selected from the group of methylsilane, dimethylsilane, trimethylsilane, tetramethylsilane and phenylmethylsilane.

23. The computer readable program of claim 14 wherein the instructions for densifying the carbon-doped silicon oxide film comprise instructions to heat the substrate.

24. The computer readable program of claim 23 wherein the instructions for densifying the carbon-doped silicon oxide film comprise instructions to heat the substrate to a temperature of between approximately 350° C. and 450° C. during the densifying.

25. The computer readable program of claim 15 wherein the instructions for densifying to carbon-doped silicon oxide film comprise instructions to generate the plasma in the processing chamber.

26. The computer readable program of claim 15 wherein the instructions for densifying the carbon-doped silicon oxide film comprise instructions to generate said plasma remote from the processing chamber and then flow the plasma into the processing chamber.

27. The computer readable program of claim 14 wherein to instructions for heating the substrate to form the carbon-doped silicon oxide layer comprise instructions to form the carbon-doped silicon oxide layer over the substrate as a result of a thermal process.

* * * * *